(12) United States Patent
Tanaka et al.

(10) Patent No.: US 11,916,520 B2
(45) Date of Patent: Feb. 27, 2024

(54) TRANSCEIVER CIRCUIT

(71) Applicant: Murata Manufacturing Co., Ltd., Kyoto (JP)

(72) Inventors: Satoshi Tanaka, Kyoto (JP); Kiichiro Takenaka, Kyoto (JP); Satoshi Arayashiki, Kyoto (JP); Satoshi Sakurai, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 17/805,277

(22) Filed: Jun. 3, 2022

(65) Prior Publication Data

US 2022/0294395 A1 Sep. 15, 2022

Related U.S. Application Data

(63) Continuation of application No. 16/867,699, filed on May 6, 2020, now Pat. No. 11,356,064.

(30) Foreign Application Priority Data

May 7, 2019 (JP) ................................. 2019-087379

(51) Int. Cl.
*H03F 1/07* (2006.01)
*H03F 1/02* (2006.01)
(Continued)

(52) U.S. Cl.
CPC ........... *H03F 1/0288* (2013.01); *H03F 3/195* (2013.01); *H03F 3/211* (2013.01); *H03F 3/245* (2013.01);
(Continued)

(58) Field of Classification Search
CPC ..................................... H03F 1/07; H03F 1/02
(Continued)

(56) References Cited

U.S. PATENT DOCUMENTS 8,036,148 B2 * 10/2011 Fukamachi .............. H04B 1/44
370/282
9,209,754 B2 * 12/2015 Embar .................. H03F 1/0288
(Continued)

FOREIGN PATENT DOCUMENTS

JP 2011009923 A 1/2011
JP 2018078612 A 5/2018
(Continued)

OTHER PUBLICATIONS

D.Y.C. Lie et al., A Review of 5G Power Amplifier Design at cm-Wave and mm-Wave Frequencies, Hindawi Wireless Communications and Mobile Computing, 2018, pp. 1-16, vol. 2018, Article ID 6793814, Department of Electrical and Computer Engineering, Texas Tech University, Lubbock, Texas, USA.
(Continued)

*Primary Examiner* — Henry Choe
(74) *Attorney, Agent, or Firm* — Pearne & Gordon LLP

(57) ABSTRACT

A Doherty amplifier including a main amplifier and a peak amplifier is mounted on a package substrate. A low noise amplifier is further mounted on the package substrate. A transmit/receive switch switches in terms of time between a transmission connection state in which an output signal of the Doherty amplifier is supplied to an antenna and a reception connection state in which a signal received by the antenna is inputted to the low noise amplifier.

19 Claims, 16 Drawing Sheets

(51) Int. Cl.
*H03F 3/21* (2006.01)
*H03F 3/24* (2006.01)
*H03F 3/195* (2006.01)
*H04B 1/44* (2006.01)
*H04B 1/04* (2006.01)

(52) U.S. Cl.
CPC ............ *H04B 1/0458* (2013.01); *H04B 1/44* (2013.01); *H03F 2200/102* (2013.01); *H03F 2200/219* (2013.01); *H03F 2200/27* (2013.01); *H03F 2200/294* (2013.01); *H03F 2200/429* (2013.01); *H03F 2200/504* (2013.01)

(58) Field of Classification Search
USPC ........................................ 330/124 R, 295, 51
See application file for complete search history.

(56) References Cited

U.S. PATENT DOCUMENTS

| | | | |
|---|---|---|---|
| 10,277,174 | B2 | 4/2019 | Lehtola |
| 10,411,653 | B2 | 9/2019 | Takenaka |
| 10,483,923 | B2 | 11/2019 | Noori et al. |
| 2002/0024390 | A1 | 2/2002 | Yamashita et al. |
| 2009/0042527 | A1* | 2/2009 | Niknejad ............... H04B 1/109 455/234.2 |
| 2009/0207764 | A1* | 8/2009 | Fukamachi ............. H04B 1/44 455/78 |
| 2010/0130145 | A1 | 5/2010 | Jang |
| 2014/0191798 | A1 | 7/2014 | Lozhkin |
| 2015/0295541 | A1 | 10/2015 | Hur et al. |
| 2016/0173044 | A1 | 6/2016 | Zhou |
| 2016/0241196 | A1 | 8/2016 | Lehtola |
| 2018/0234058 | A1 | 8/2018 | Noori et al. |

FOREIGN PATENT DOCUMENTS

| | | |
|---|---|---|
| JP | 2018085635 A | 5/2018 |
| JP | 2018160756 A | 10/2018 |
| KR | 10-2016-0066593 A | 6/2016 |
| KR | 10-2016-0100793 A | 8/2016 |

OTHER PUBLICATIONS

Notification of Preliminary Rejection for KR Patent Application No. 10-2020-0045050 dated Jan. 20, 2021.

* cited by examiner

TRANSCEIVER CIRCUIT

CROSS REFERENCE TO RELATED APPLICATIONS

This is a continuation of U.S. patent application Ser. No. 16/867,699 filed on May 6, 2020, which application claims priority from Japanese Patent Application No. 2019-087379 filed on May 7, 2019. The content of this application is incorporated herein by reference in its entirety.

BACKGROUND

The present disclosure relates to a transceiver circuit. A power amplifier circuit based on an envelope tracking (ET) scheme is known as a power amplifier circuit for a high-frequency signal in the radio frequency range. In the ET scheme, a voltage waveform that changes in accordance with the envelope of a modulated signal is generated by a high-speed direct current-direct current (DC-DC) converter and is used as a power supply voltage for a power amplifier. Due to the limitations of the operation speed of a high-speed DC-DC converter, it is difficult for an amplifier based on the ET scheme to support modulated signals in a wide frequency range.

There is a known Doherty amplifier that provides high efficiency over a wide range of output voltage levels without necessarily needing to rapidly change a power supply voltage (Japanese Unexamined Patent Application Publication No. 2018-85635). The Doherty amplifier has a configuration in which a main amplifier biased for Class AB operation and a peak amplifier biased for Class C operation operate in parallel. When an input signal is small in magnitude, only the main amplifier operates whilst the peak amplifier does not operate. When the output power level of the main amplifier approaches the saturation level and the peak amplifier is not in operation, the efficiency of the main amplifier corresponds to the overall efficiency, resulting in the Doherty amplifier exhibiting high efficiency.

The peak amplifier starts operating at the timing when the output of the main amplifier approaches saturation, and the load impedance of the main amplifier decreases gradually. During this period, the overall efficiency of the Doherty amplifier starts decreasing. When the output power level of the peak amplifier approaches the saturation level, the overall efficiency of the Doherty amplifier increases again and becomes close to the peak value. Accordingly, high efficiency can be achieved over a wide output power range from the vicinity of the saturation point of the output power level of the main amplifier to the vicinity of the saturation point of the output power level of the peak amplifier.

In the Doherty amplifier, the load impedance of the main amplifier is changed by the operation of the peak amplifier to extend the range of output power levels over which the Doherty amplifier operates with high efficiency. Thus, the overall gain of the Doherty amplifier decreases from the vicinity of an initial saturation of the output power level of the main amplifier. Consequently, the input signal level and the output power level have a nonlinear relationship. To compensate for the nonlinear relationship, a digital pre-distortion system is applied. In the digital pre-distortion system, a signal for canceling distortion of the output power versus gain characteristic and the output power versus phase characteristic of the amplifier is inserted in the modulated signal in addition to the baseband IQ signal, thereby canceling the distortion of the amplifier.

The digital pre-distortion system uses a finite-order polynomial to represent a signal for canceling distortion. In addition, there is a limitation of the bandwidth of a modulated signal to which distortion for cancelation is added. Due to the limitation of the bandwidth, low-order harmonic distortion, such as about third or fifth harmonic distortion, can be canceled, whereas high-order harmonic distortion, such as about tenth harmonic distortion, is difficult to cancel.

In the fourth- or fifth-generation wireless communication standard, the frequency division duplexing (FDD) scheme is widely used in, in particular, the 1 GHz band (greater than or equal to 0.6 GHz and less than or equal to 1.0 GHz), called the low band, or the 2 GHz band (greater than or equal to 1.4 GHz and less than or equal to 2.2 GHz), called the middle band. In mobile terminals and the like, it is common to share a single antenna for a transmit antenna and a receive antenna. When a transceiver circuit of such a mobile terminal or the like includes a Doherty amplifier with a digital pre-distortion system, adjacent channel leakage power resulting from high-order harmonic components of the transmit signal falls into the receive band, leading to an increased risk of deterioration of reception sensitivity.

BRIEF SUMMARY

Accordingly, the present disclosure provides a transceiver circuit in which reception sensitivity deterioration is less likely to occur even when a Doherty amplifier is used.

According to embodiments of the present disclosure, a transceiver circuit includes a package substrate, a Doherty amplifier mounted on the package substrate and including a main amplifier and a peak amplifier, a low noise amplifier mounted on the package substrate, and a transmit/receive switch that switches in terms of time between a transmission connection state in which an output signal of the Doherty amplifier is supplied to an antenna and a reception connection state in which a signal received by the antenna is input to the low noise amplifier.

The use of a Doherty amplifier makes it possible to amplify a signal with high efficiency. In addition, the transmission connection state and the reception connection state are switched in terms of time such that the Doherty amplifier operates in accordance with a time division duplexing (TDD) scheme. Thus, reception sensitivity is not affected by adjacent channel leakage power resulting from high-order harmonic components of a transmit signal.

Other features, elements, characteristics and advantages of the present disclosure will become more apparent from the following detailed description of embodiments of the present disclosure with reference to the attached drawings.

DETAILED DESCRIPTION

First Embodiment

A transceiver circuit according to a first embodiment will be described with reference to FIGS. 1 to 3.

Figure 1:
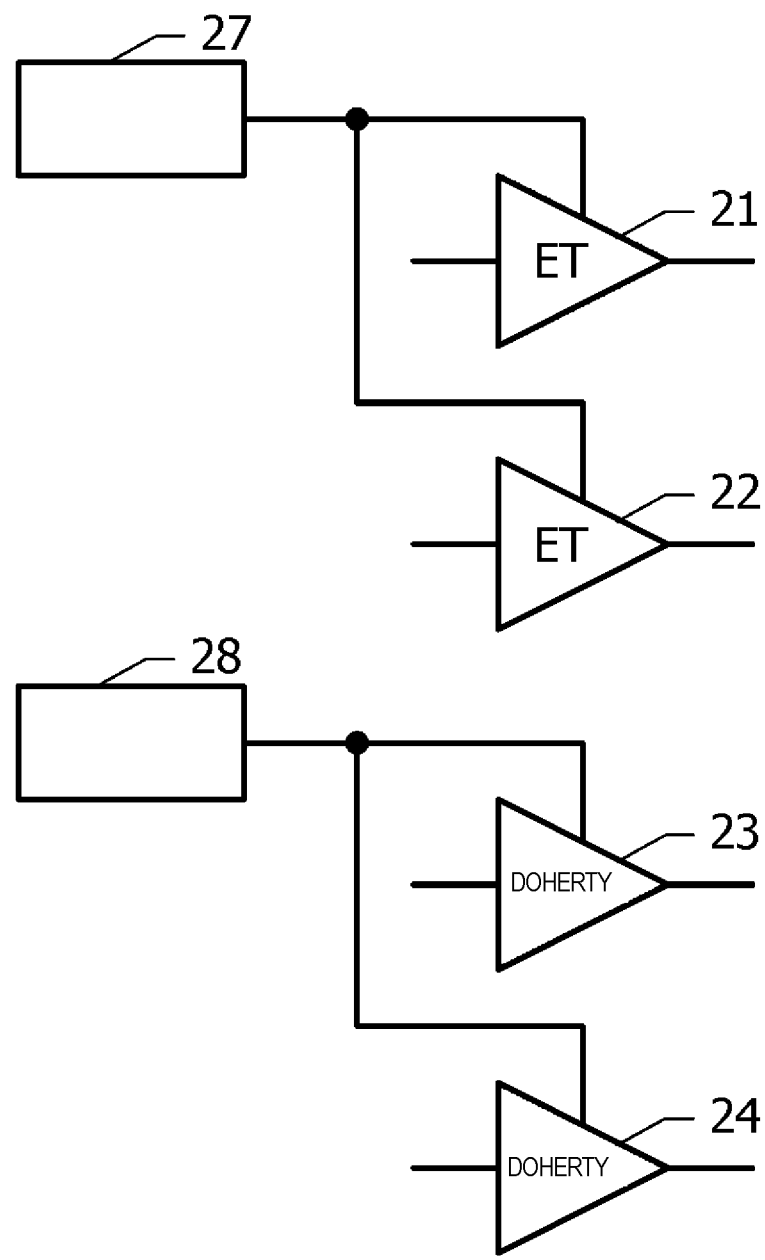
FIG. 1 is a block diagram illustrating a configuration of a transmit power amplifier of a communication device including a transceiver circuit according to a first embodiment.

FIG. 1 is a block diagram illustrating a configuration of a transmit power amplifier of a communication device including the transceiver circuit according to the first embodiment. Envelope tracking amplifiers (hereinafter referred to as ET amplifiers) 21 and 22 are used as amplifiers for transmit signals in the low band (e.g., a frequency range greater than or equal to 0.6 GHz and less than or equal to 1.0 GHz) and the middle band (e.g., a frequency range greater than or equal to 1.4 GHz and less than or equal to 2.2 GHz), respectively. A power supply circuit 27 configured to generate a voltage waveform that changes in accordance with the envelope of an input signal supplies a power supply voltage to the ET amplifiers 21 and 22. The power supply circuit 27 is implemented using a high-speed DC-DC converter, for example. The frequency division duplexing (FDD) scheme is employed in the low band and the middle band as a two-way communication scheme.

Doherty amplifiers 23 and 24 are used as amplifiers for transmit signals in the high band (e.g., a frequency range greater than or equal to 2.3 GHz and less than or equal to 2.7 GHz) and the ultra-high band (e.g., a frequency range greater than or equal to 3.3 GHz and less than or equal to 5.0 GHz), respectively. A power supply circuit 28 configured to generate a voltage in accordance with the average output power supplies a power supply voltage to the Doherty amplifiers 23 and 24. The time division duplexing (TDD) scheme is employed in the high band and the ultra-high band as a two-way communication scheme. The power supply circuit 28 is implemented using a step-down DC-DC converter or a step-up/down DC-DC converter, for example.

Figure 2A:
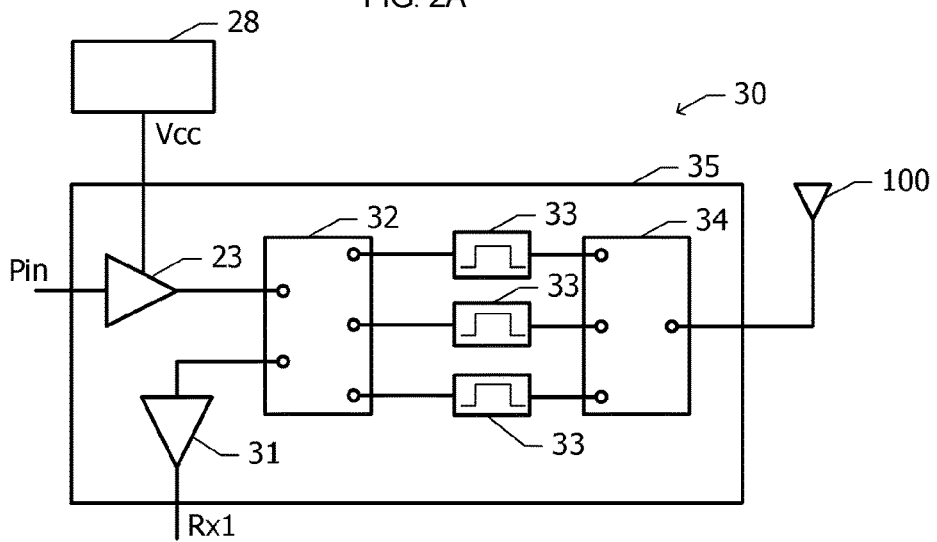
FIG. 2A is a block diagram of the transceiver circuit according to the first embodiment.
Figure 2B:
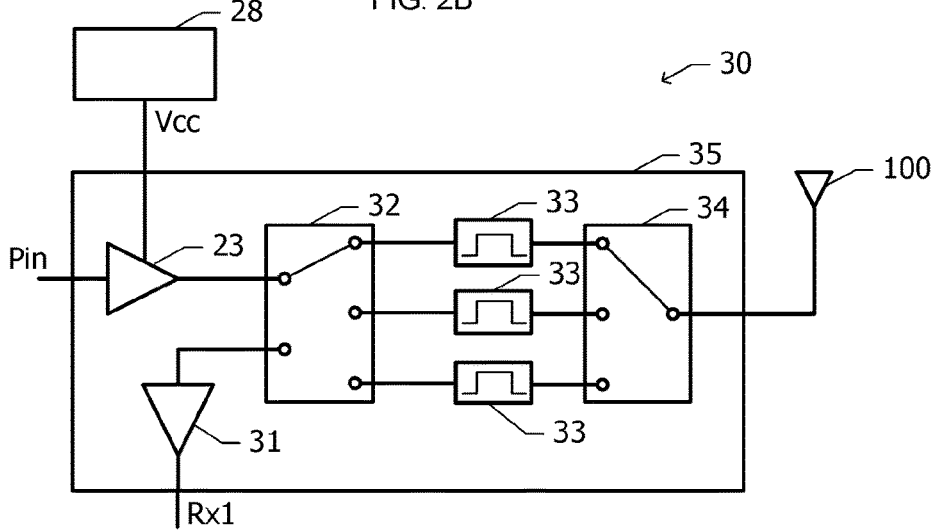
FIGS. 2B and 2C are block diagrams illustrating connection states during a transmission period and a reception period, respectively.
Figure 2C:
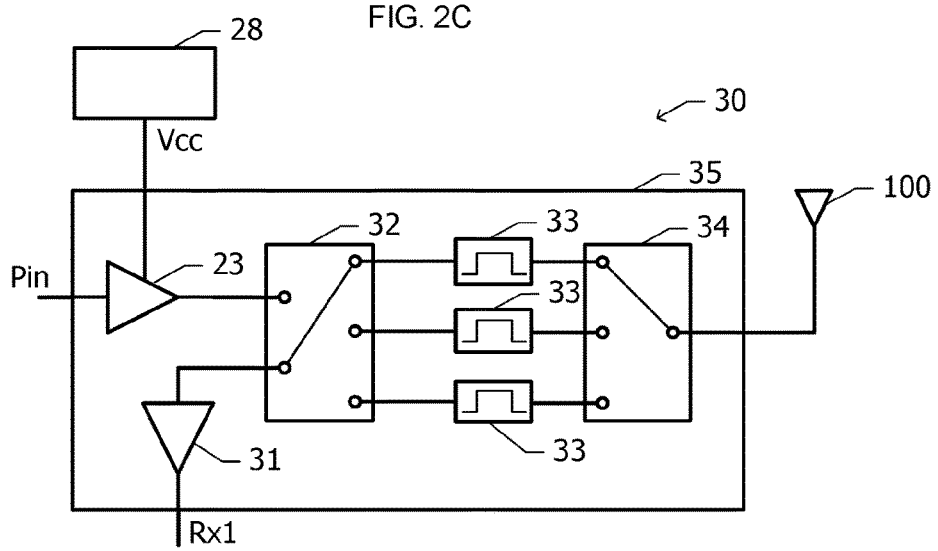

FIG. 2A is a block diagram of a transceiver circuit 30 according to the first embodiment. FIGS. 2B and 2C are block diagrams illustrating connection states during a transmission period and a reception period, respectively.

The transceiver circuit 30 includes the Doherty amplifier 23 for the high band (hereinafter also referred to as the high-band Doherty amplifier 23), a low noise amplifier 31, a transmit/receive switch 32, a plurality of band pass filters 33, and an antenna switch 34. The Doherty amplifier 24 for the ultra-high band (hereinafter also referred to as the ultra-high-band Doherty amplifier 24) (FIG. 1) can also be incorporated in a transceiver circuit having a configuration similar to that of the transceiver circuit 30. A matching circuit is further arranged, as necessary. The circuit components described above are mounted on a common package substrate 35.

A TDD high-band high-frequency signal Pin is input to the Doherty amplifier 23. For example, the high-frequency signal Pin is output from a driver-stage amplifier in the preceding stage, which is formed on the same semiconductor chip as that of the Doherty amplifier 23. Examples of the TDD high band include bands 38, 40, 41, and n41. The Doherty amplifier 23 is a multi-band amplifier capable of amplifying signals of these multiple bands.

An amplified receive signal Rx1 is output from an output terminal of the low noise amplifier 31. The power supply circuit 28 supplies a power supply voltage Vcc to the Doherty amplifier 23.

An output terminal of the Doherty amplifier 23 and an input terminal of the low noise amplifier 31 are each connected to a contact of the transmit/receive switch 32. Three other contacts of the transmit/receive switch 32 are connected to three contacts of the antenna switch 34 via the respective band pass filters 33. The three band pass filters 33 have different pass frequency bands. One other contact of the antenna switch 34 is connected to an antenna port 100 via a feed line.

The transmit/receive switch 32 has two states, namely, a transmission connection state and a reception connection state, and switches in terms of time between the two states. In the transmission connection state (FIG. 2B), the output terminal of the Doherty amplifier 23 is connected to one of the three band pass filters 33. In the reception connection state (FIG. 2C), one of the three band pass filters 33 is connected to the input terminal of the low noise amplifier 31. The antenna switch 34 connects one of the band pass filters 33, which is connected to the Doherty amplifier 23 or the low noise amplifier 31, to the antenna port 100 in either the transmission connection state or the reception connection state.

Figure 3:
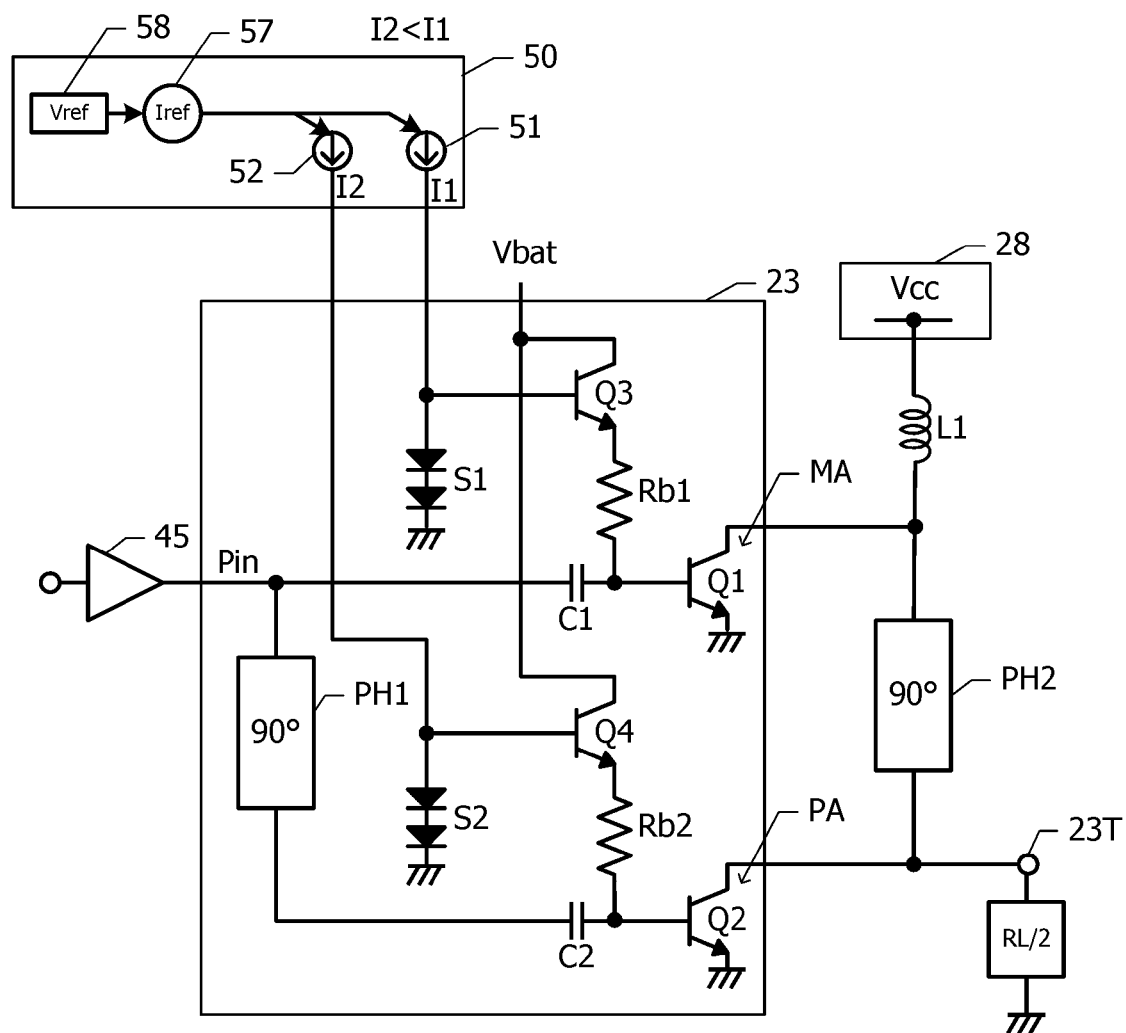
FIG. 3 is an equivalent circuit diagram of a Doherty amplifier and its peripheral circuits of the transceiver circuit according to the first embodiment.

FIG. 3 is an equivalent circuit diagram of the Doherty amplifier 23 and its peripheral circuits included in the transceiver circuit 30 according to the first embodiment.

The high-frequency signal Pin, which is output from a driver-stage amplifier 45, is input to the Doherty amplifier 23. The high-frequency signal Pin is input to the base of a transistor Q1 of a main amplifier MA via an input capacitor C1 and is also input to the base of a transistor Q2 of a peak amplifier PA via a phase shift circuit PH1 and an input capacitor C2. Each of the transistors Q1 and Q2 is implemented using a heterojunction bipolar transistor (HBT), for example. The phase shift circuit PH1 delays the phase of a high-frequency signal by 90°. The phase shift circuit PH1 is implemented using, for example, a transmission line having a line width that is a quarter (¼) wave length.

A bias circuit for the transistor Q1 includes an emitter follower transistor Q3, a bias resistance element Rb1, and a temperature compensation circuit S1. A bias power supply voltage Vbat is applied to the collector of the emitter follower transistor Q3, and a bias current is supplied to the base of the transistor Q1 via the emitter follower transistor Q3 and the bias resistance element Rb1. A bias current I1 is supplied to the base of the emitter follower transistor Q3 from a control circuit 50. The base of the emitter follower transistor Q3 is grounded via the temperature compensation circuit S1.

Likewise, a bias circuit for the transistor Q2 is constituted by an emitter follower transistor Q4, a bias resistance element Rb2, and a temperature compensation circuit S2. The bias power supply voltage Vbat, which is applied to the collector of the emitter follower transistor Q3, is also applied to the collector of the emitter follower transistor Q4. A bias current I2 is supplied to the base of the emitter follower transistor Q4 from the control circuit 50.

The temperature compensation circuits S1 and S2 are each constituted by two diodes that are connected in series with each other. These diodes are implemented using, for example, heterojunction bipolar transistors with the base and collector short-circuited (diode-connected). The emitter follower transistors Q3 and Q4 are implemented using heterojunction bipolar transistors.

The control circuit 50 includes a reference voltage generation circuit 58, a reference current generation circuit 57, and current sources 51 and 52. The reference current generation circuit 57 generates a reference current Iref on the basis of a reference voltage Vref generated by the reference voltage generation circuit 58. The current sources 51 and 52 multiply the reference current Iref by n1 and n2 to generate the bias currents I1 and I2, respectively. The ratio of the bias currents I1 and I2 is determined by the ratio of the magnifications n1 and n2. The ratio of the magnifications n1 and n2 is determined by the ratio of the dimensions of current output transistors constituting the current sources 51 and 52. Thus, the ratio of the bias currents I1 and I2 is maintained constant with high accuracy. The ratio can be adjusted by, for example, switching the sizes of the current output transistors. The control circuit 50 is implemented by, for example, an integrated circuit element that uses a silicon substrate.

The bias currents I1 and I2 are supplied to the bases of the emitter follower transistors Q3 and Q4, respectively. The bias current I1 is set to allow the transistor Q1 of the main amplifier MA to operate in Class AB bias conditions. The bias current I2 is set to substantially 0 to allow the transistor Q2 of the peak amplifier PA to operate in Class C bias conditions.

The collector of the transistor Q2 of the peak amplifier PA is connected to an output terminal 23T, and the collector of the transistor Q1 of the main amplifier MA is connected to the output terminal 23T via a phase shift circuit PH2. The phase shift circuit PH2 delays the phase of a high-frequency signal by 90°. The phase shift circuit PH2 is implemented using, for example, a transmission line having a line width that is a quarter (¼) wave length. The Doherty amplifier 23 includes the transistor Q1 and the transistor Q2, which are connected in parallel to each other.

The power supply voltage Vcc is applied to the collector of the transistor Q1 from the power supply circuit 28 via a choke inductor L1 for blocking high-frequency current. The power supply voltage Vcc is also applied to the collector of the transistor Q2 from the power supply circuit 28 via the choke inductor L1 and the phase shift circuit PH2.

Next, the operation of the Doherty amplifier 23 illustrated in FIG. 3 will be described. It is assumed that a load connected to the output terminal 23T has a load impedance whose magnitude is given by RL/2. Consideration is given of a case where the high-frequency signal Pin increases from a low level. Since the bias current of the transistor Q2 of the peak amplifier PA is set to be low, the peak amplifier PA does not substantially operate in a region where the level of the high-frequency signal Pin is low. At this time, the output impedance of the peak amplifier PA is sufficiently high.

Due to the operation of the phase shift circuit PH2 connected between the collector of the transistor Q2 of the peak amplifier PA and the collector of the transistor Q1 of the main amplifier MA, the load impedance seen from the collector of the transistor Q1 is given by 2×RL.

When the level of the high-frequency signal Pin is increased, two changes occur. One of the changes is that the level of the output of the main amplifier MA also increases. When the output of the main amplifier MA approaches the value given by $Vcc^2/(2 \times RL)$, the main amplifier MA saturates. The other change is that, when the level of the high-frequency signal Pin reaches a certain level, the peak amplifier PA, which is biased for Class C operation, starts operating. The output signal of the peak amplifier PA is shifted in phase by 90° from the output signal of the main amplifier MA due to the presence of the phase shift circuit PH1 on the input side thereof. If the output signal of the peak amplifier PA is added to the load, the load is driven in phase with the output signal of the main amplifier MA.

When the level of the high-frequency signal Pin is further increased, the peak amplifier PA also saturates. In this case, the load impedance of the load side seen from each of the main amplifier MA and the peak amplifier PA is seen to be RL. Accordingly, as the level of the high-frequency signal Pin increases from the timing at which the peak amplifier PA starts operating, the load impedance of the main amplifier MA decreases gradually. Thus, as the level of the high-frequency signal Pin increases, the gain of the Doherty amplifier 23 decreases gradually and then increases, reaching saturation.

Next, advantageous effects of the first embodiment will be described.

The first embodiment uses the Doherty amplifier 23 to amplify a high-band high-frequency signal and thus does not require a high-speed DC-DC converter for envelope tracking. The Doherty amplifier 23 is not constrained by the response speed of a high-speed DC-DC converter and is thus capable of also supporting a wide-band modulated signal whose band width exceeds 100 MHz, for example. High efficiency can be realized over a further wide output power range.

Even if a digital pre-distortion system is applied to cancel distortion of the output power versus gain characteristic and the output power versus phase characteristic of the Doherty amplifier 23, high-order distortion that is difficult to cancel using the digital pre-distortion system, such as about the tenth or higher-order harmonic distortion, is superimposed on a transmit signal. When a Doherty amplifier is used in the FDD scheme, if such high-order distortion of the transmit signal falls into the receive band, reception sensitivity deteriorates. The deterioration of reception sensitivity is noticeable when a common antenna is used for transmission and reception. In the first embodiment, since the Doherty amplifier 23 is used for TDD communication, even if high-order distortion occurs in a transmit signal, reception sensitivity does not deteriorate. Therefore, it is possible to use a common antenna for transmission and reception.

In the first embodiment, furthermore, the Doherty amplifier 23 for transmit signals and the low noise amplifier 31 for receive signals are mounted on the same package substrate 35. This configuration can reduce the number of components to be mounted compared with a configuration in which the Doherty amplifier 23 and the low noise amplifier 31 are separately mounted on motherboards or the like. In addition, the TDD scheme is adopted for both a transmit signal to be amplified by the Doherty amplifier 23 and a receive signal to be amplified by the low noise amplifier 31. Thus, the Doherty amplifier 23 does not operate during the operation of the low noise amplifier 31. Therefore, an advantageous effect is achieved such that the low noise amplifier 31 is less susceptible to noise generated by the Doherty amplifier 23.

Next, a transceiver circuit 30 according to a modification of the first embodiment will be described with reference to FIG. 4.

Figure 4:
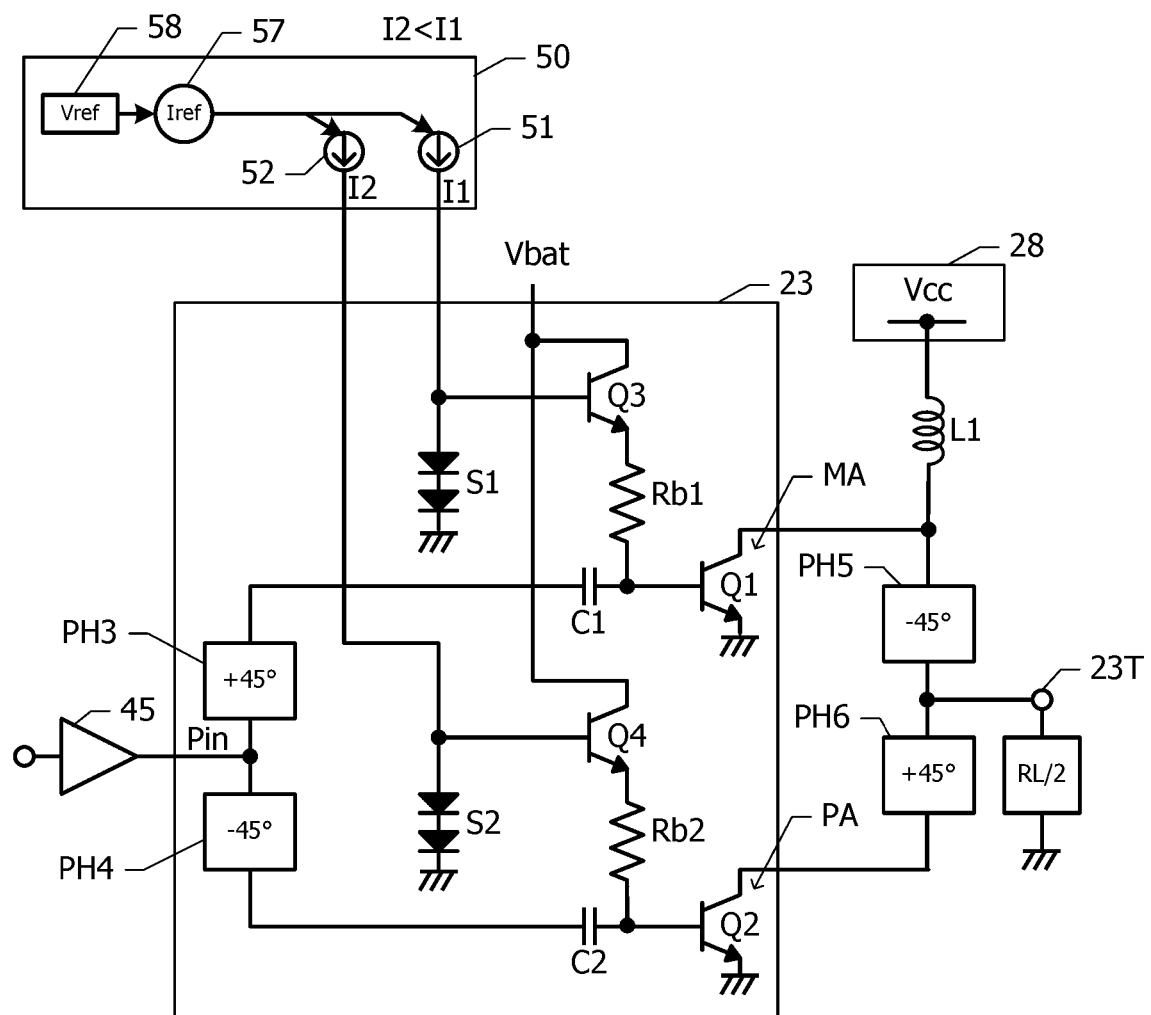
FIG. 4 is an equivalent circuit diagram of a Doherty amplifier and its peripheral circuits mounted in a transceiver circuit according to a modification of the first embodiment.

FIG. 4 is an equivalent circuit diagram of a Doherty amplifier 23 and its peripheral circuits of the transceiver circuit 30 according to a modification of the first embodiment. In the first embodiment, the 90° phase shift circuits PH1 and PH2 are provided on the input side of the peak amplifier PA and the output side of the main amplifier MA, respectively. In this modification, in contrast, +45° phase shift circuits PH3 and PH6 are provided on the input side of the main amplifier MA and the output side of the peak amplifier PA, respectively, and −45° phase shift circuits PH5 and PH4 are provided on the output side of the main amplifier MA and the input side of the peak amplifier PA, respectively.

Also in this modification, a high-frequency signal amplified by the main amplifier MA and output to the output terminal 23T and a high-frequency signal amplified by the peak amplifier PA and output to the output terminal 23T are in phase with each other. Thus, advantages similar to those of the first embodiment are achieved.

Second Embodiment

Next, a transceiver circuit according to a second embodiment will be described with reference to FIGS. 5 and 6. Hereinafter, portions that are common to the transceiver circuit according to the second embodiment and the transceiver circuit 30 according to the first embodiment (FIG. 2) are not described.

Figure 5:
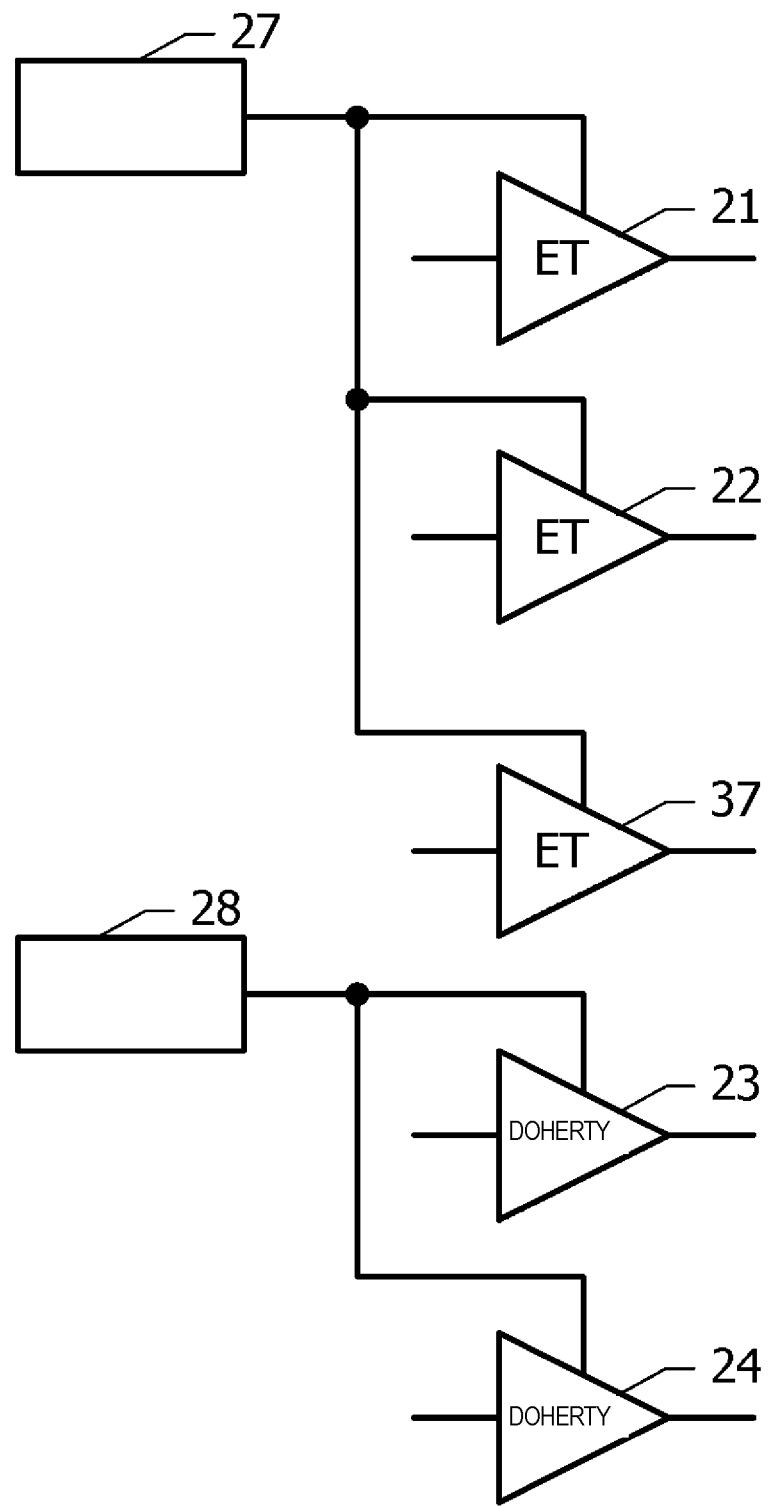
FIG. 5 is a block diagram illustrating a configuration of a transmit power amplifier of a communication device including a transceiver circuit according to a second embodiment.

FIG. 5 is a block diagram illustrating a configuration of a transmit power amplifier of a communication device including the transceiver circuit according to the second embodiment. In the first embodiment, the Doherty amplifier 23 is used as a high-band power amplifier. In the second embodiment, the Doherty amplifier 23 and an ET amplifier 37 are used as high-band power amplifiers. The ET amplifier 37 amplifies an FDD transmit signal, and the Doherty amplifier 23 amplifies a TDD transmit signal.

An envelope tracking power supply circuit 27 supplies a power supply voltage to the ET amplifier 37, and a Doherty amplifier power supply circuit 28 supplies a power supply voltage to the Doherty amplifier 23.

Figure 6:
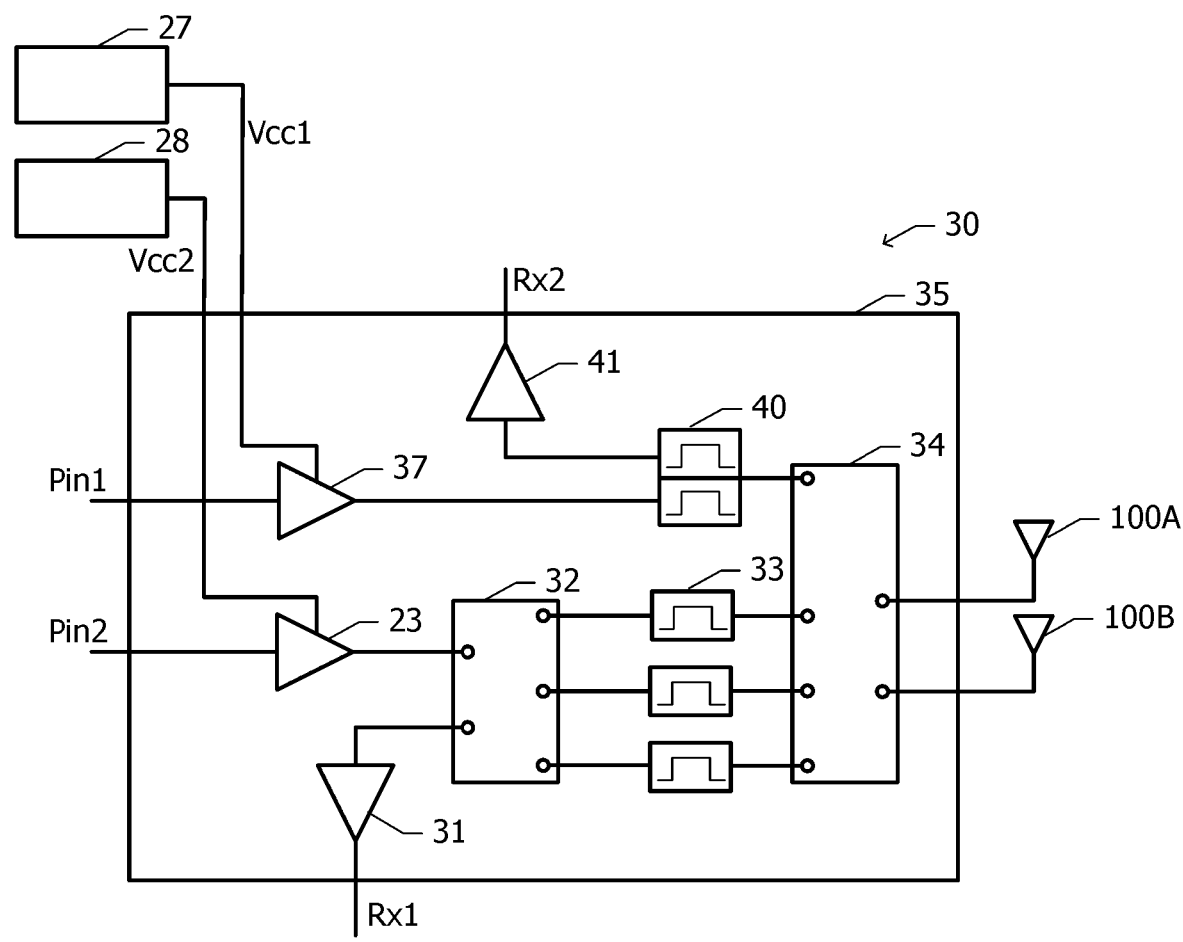
FIG. 6 is a block diagram of a high-band ET amplifier, a Doherty amplifier, and their peripheral circuits included in the transceiver circuit according to the second embodiment.

FIG. 6 is a block diagram of the high-band ET amplifier 37, the Doherty amplifier 23, and their peripheral circuits included in the transceiver circuit 30 according to the second embodiment. The ET amplifier 37 and the Doherty amplifier 23 are mounted on the package substrate 35. An FDD high-band high-frequency signal Pin1 is input to the ET amplifier 37, and a TDD high-band high-frequency signal Pin2 is input to the Doherty amplifier 23. The high-frequency signal Pin1 is, for example, a signal in the uplink frequency range of band 7.

The configurations of the Doherty amplifier 23, the low noise amplifier 31, the transmit/receive switch 32, and the band pass filter 33 are substantially the same as the configurations of the Doherty amplifier 23, the low noise amplifier 31, the transmit/receive switch 32, and the band pass filter 33 of the transceiver circuit 30 according to the first embodiment (FIG. 2A), respectively.

A transmit terminal of a duplexer 40 is connected to an output terminal of the ET amplifier 37, and a receive terminal of the duplexer 40 is connected to an input terminal of a low noise amplifier 41. An antenna terminal of the duplexer 40 is connected to a contact of the antenna switch 34. The duplexer 40 separates a transmit path and a receive path from each other. Two antennas ports 100A and 100B are connected to two contacts of the antenna switch 34. The antenna switch 34 connects one of the three band pass filters 33 or the duplexer 40 to either the antenna port 100A or the antenna port 100B.

When the antenna switch 34 connects one of the three band pass filters 33 to either the antenna port 100A or the antenna port 100B, the transceiver circuit 30 activates the Doherty amplifier 23 and the low noise amplifier 31 to perform TDD communication. When the antenna switch 34 connects the duplexer 40 to either the antenna port 100A or the antenna port 100B, the transceiver circuit 30 activates the ET amplifier 37 and the low noise amplifier 41 to perform FDD communication. Accordingly, the transceiver circuit 30 is capable of amplifying both a TDD high-frequency signal and an FDD high-frequency signal.

An FDD receive signal is input to the low noise amplifier 41 via the duplexer 40. The low noise amplifier 41 outputs an amplified receive signal Rx2.

The envelope tracking power supply circuit 27 supplies a power supply voltage Vcc1 to the ET amplifier 37. The power supply voltage Vcc1 has a voltage waveform that changes in accordance with the envelope waveform of the high-frequency signal Pin1. The Doherty amplifier power supply circuit 28 supplies a constant power supply voltage Vcc2 to the Doherty amplifier 23.

Next, advantageous effects of the second embodiment will be described.

Like the first embodiment, the second embodiment also uses the Doherty amplifier 23 to amplify a TDD transmit signal and thus achieves advantages similar to those of the first embodiment. In the second embodiment, furthermore, the ET amplifier 37 can be used to transmit and receive an FDD high-band signal. Accordingly, the transceiver circuit 30 according to the second embodiment is capable of supporting, among the plurality of bands included in the high band, both the FDD bands and the TDD bands.

In addition, both the ET amplifier 37 and the Doherty amplifier 23 are mounted on the same package substrate 35. Thus, the number of components to be mounted can be reduced compared with the individual mounting of the ET amplifier 37 and the Doherty amplifier 23 on motherboards.

To reduce the number of components to be mounted on the package substrate 35, the Doherty amplifier 23 and a driver-stage amplifier in the preceding stage are formed on the same compound semiconductor substrate. Also, the ET amplifier 37 and a driver-stage amplifier in the preceding stage are formed on the same compound semiconductor substrate.

Third Embodiment

Next, a transceiver circuit according to a third embodiment will be described with reference to FIGS. 7 and 8. Hereinafter, portions that are common to the transceiver circuit according to the third embodiment and the transceiver circuit 30 according to the second embodiment (FIG. 6) are not described.

Figure 7:
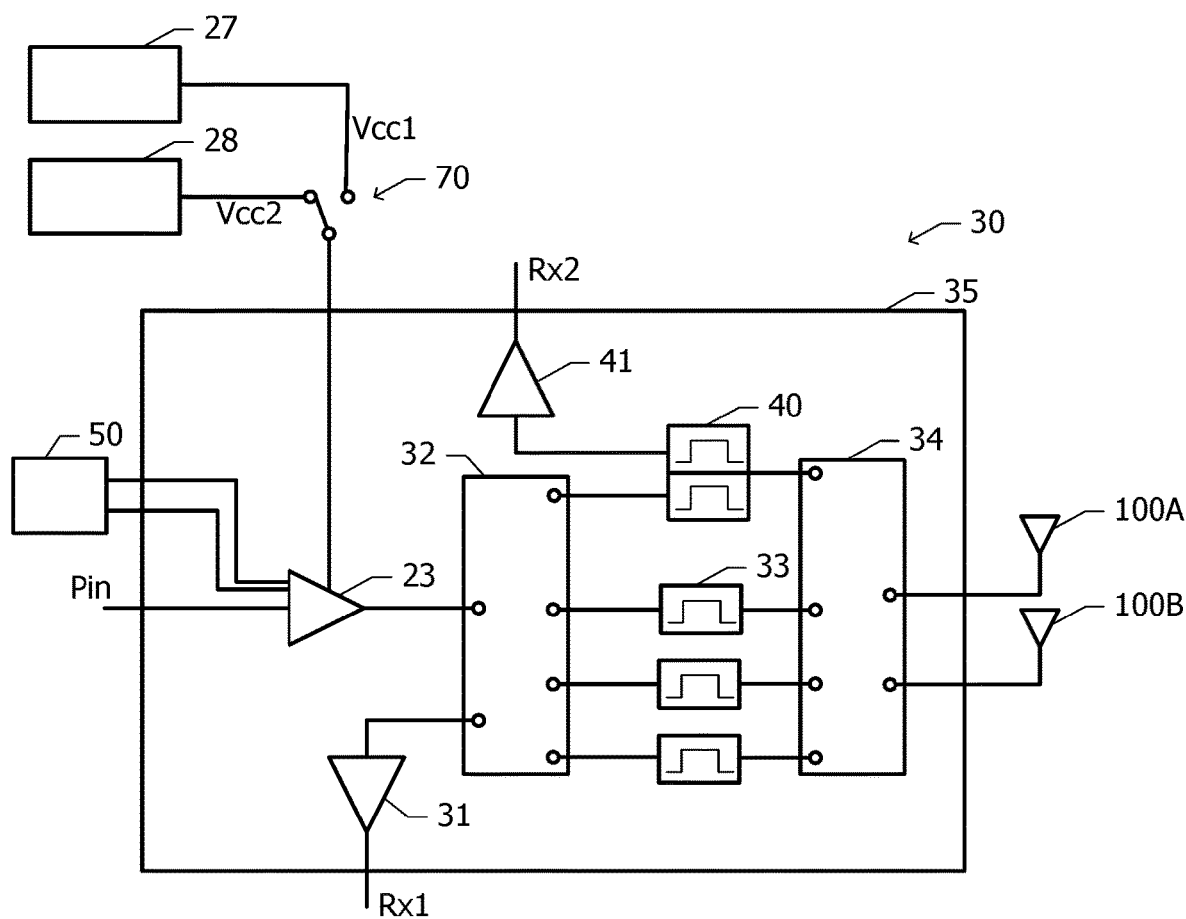
FIG. 7 is a block diagram of a high-band Doherty amplifier and its peripheral circuits included in a transceiver circuit according to a third embodiment.

FIG. 7 is a block diagram of a high-band Doherty amplifier 23 and its peripheral circuits included in a transceiver circuit 30 according to the third embodiment. The transceiver circuit 30 according to the second embodiment (FIG. 6) includes the high-band ET amplifier 37 for amplifying an FDD transmit signal, and the Doherty amplifier 23 for amplifying a TDD transmit signal. In the third embodiment, the Doherty amplifier 23 operates as both a Doherty amplifier and an ET amplifier. That is, the Doherty amplifier 23 is also used as an ET amplifier.

A power supply switch 70 switches the power supply voltage to be supplied to the Doherty amplifier 23 between the power supply voltage Vcc1 output from the envelope tracking power supply circuit 27 and the power supply voltage Vcc2 output from the Doherty amplifier power supply circuit 28. A control circuit 50 selects one of a bias condition for allowing the Doherty amplifier 23 to operate as a Doherty amplifier and a bias condition for allowing the Doherty amplifier 23 to operate as an ET amplifier.

Figure 8:
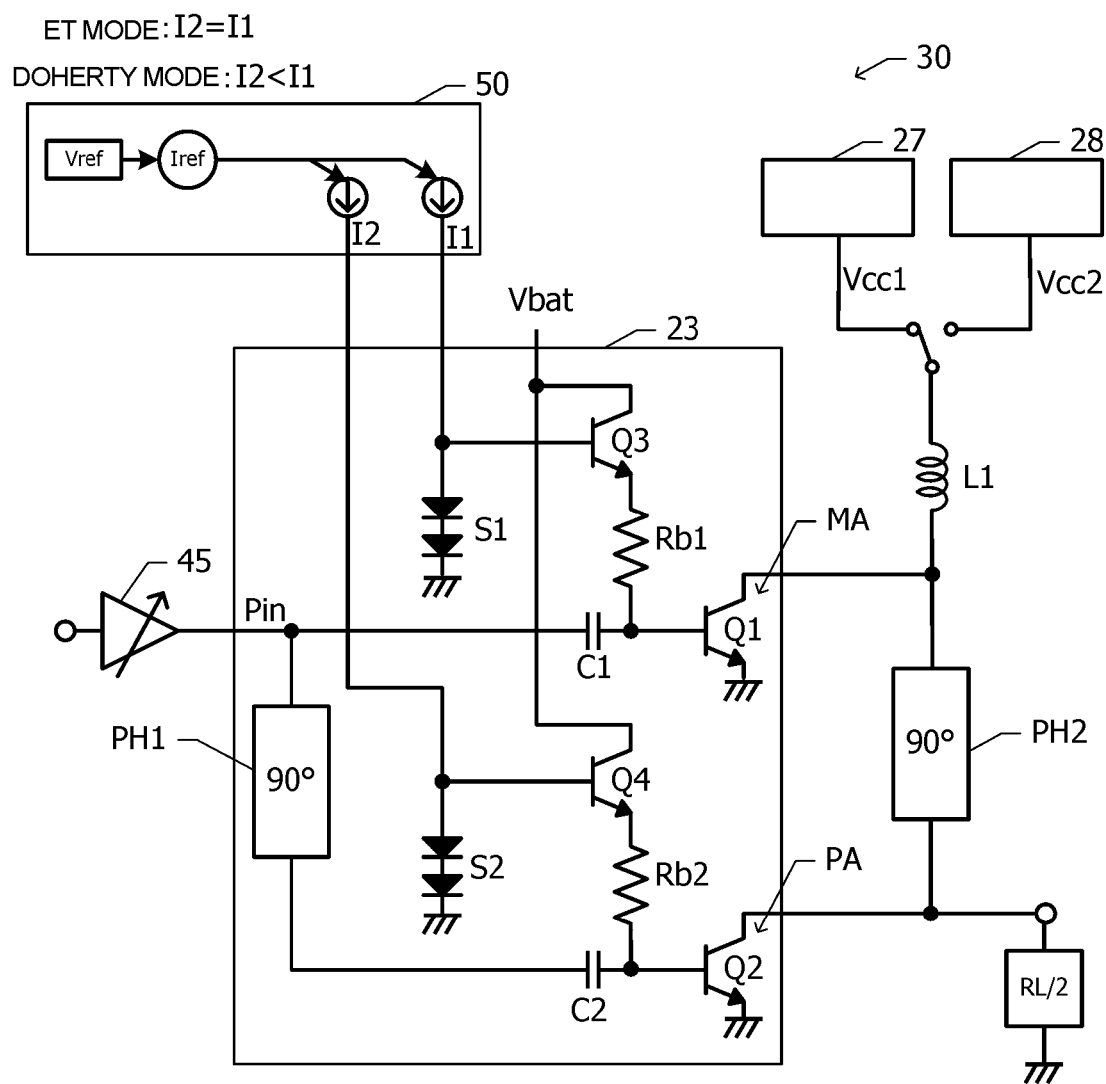
FIG. 8 is an equivalent circuit diagram of the Doherty amplifier and its peripheral circuits included in the transceiver circuit according to the third embodiment.

FIG. 8 is an equivalent circuit diagram of the Doherty amplifier 23 and its peripheral circuits included in the transceiver circuit 30 according to the third embodiment. The configuration of the Doherty amplifier 23 is substantially the same as the configuration of the Doherty amplifier 23 included in the transceiver circuit 30 according to the first embodiment (FIG. 3). In the first embodiment, the bias currents I1 and I2 are set to allow the main amplifier MA to operate in Class AB and the peak amplifier PA to operate in Class C. That is, the bias currents I1 and I2 have a magnitude relationship of I2<I1.

In the third embodiment, the control circuit 50 switches the operation mode of the Doherty amplifier 23 between an ET mode in which the Doherty amplifier 23 operates as an ET amplifier and a Doherty mode in which the Doherty amplifier 23 operates as a Doherty amplifier.

In the ET mode, the bias point of the transistor Q1 and the bias point of the transistor Q2 are set to be substantially the same to allow the Doherty amplifier 23 to operate as an envelope tracking amplifier. At this time, the bias current I1 of the emitter follower transistor Q3 and the bias current I2 of the emitter follower transistor Q4 are substantially equal to each other. Further, the power supply switch 70 applies the power supply voltage Vcc1 generated by the envelope tracking power supply circuit 27 to the collectors of the transistors Q1 and Q2.

In the Doherty mode, the bias conditions of the transistors Q1 and Q2 and the power supply voltage conditions are similar to the conditions for the Doherty amplifier 23 according to the first embodiment.

When the main amplifier MA and the peak amplifier PA are operating in the Doherty mode, the load impedance of the load side seen from the collectors of the transistors Q1 and Q2 changes in accordance with the operating state of the peak amplifier PA. In the ET mode, since the bias point of the transistor Q1 and the bias point of the transistor Q2 are set to be substantially the same, the operating states of the transistors Q1 and Q2 are substantially the same. Thus, the load impedance of the load side seen from the collectors of the transistors Q1 and Q2 remains substantially constant. At this time, the load impedance is substantially equal to RL, which is the load impedance obtained when the peak amplifier PA is in saturation while the Doherty amplifier 23 is operating in the Doherty mode, regardless of the input power. When the Doherty amplifier 23 is operating in the Doherty mode, in contrast, the peak amplifier PA does not operate if the input power is low. Thus, the load impedance of the main amplifier MA is given by 2×RL due to the operation of the phase shift circuit PH2. Therefore, when the Doherty amplifier 23 is operating in the ET mode, the gain in the low-power region is reduced compared with when the Doherty amplifier 23 is operating in the Doherty mode.

In the third embodiment, the gain of the driver-stage amplifier 45 is changed so as to compensate for the reduction of the gain in the low-power region. That is, the gain of the driver-stage amplifier 45 obtained when the Doherty amplifier 23 is operating in the ET mode is set to be larger than the gain of the driver-stage amplifier 45 obtained when the Doherty amplifier 23 is operating in the Doherty mode. This can provide substantially the same gain when the Doherty amplifier 23 is operating in the ET mode and when the Doherty amplifier 23 is operating in the Doherty mode.

In the Doherty mode, the main amplifier including the transistor Q1 is caused to operate in Class AB, and the peak amplifier including the transistor Q2 is caused to operate in Class C. At this time, the power supply switch 70 applies the power supply voltage Vcc2 generated by the Doherty amplifier power supply circuit 28 to the collectors of the transistors Q1 and Q2.

Next, advantageous effects of the third embodiment will be described.

In the third embodiment, the single Doherty amplifier 23 can operate also as an ET amplifier. Thus, the number of components used can be reduced compared with a case where both an ET amplifier and a Doherty amplifier are mounted in the transceiver circuit 30.

Fourth Embodiment

Next, a transceiver circuit 30 according to a fourth embodiment will be described with reference to FIGS. 9, 10, and 11. Hereinafter, portions that are common to the transceiver circuit 30 according to the fourth embodiment and the transceiver circuit 30 according to the first embodiment (FIGS. 1 to 3) are not described.

Figure 9:
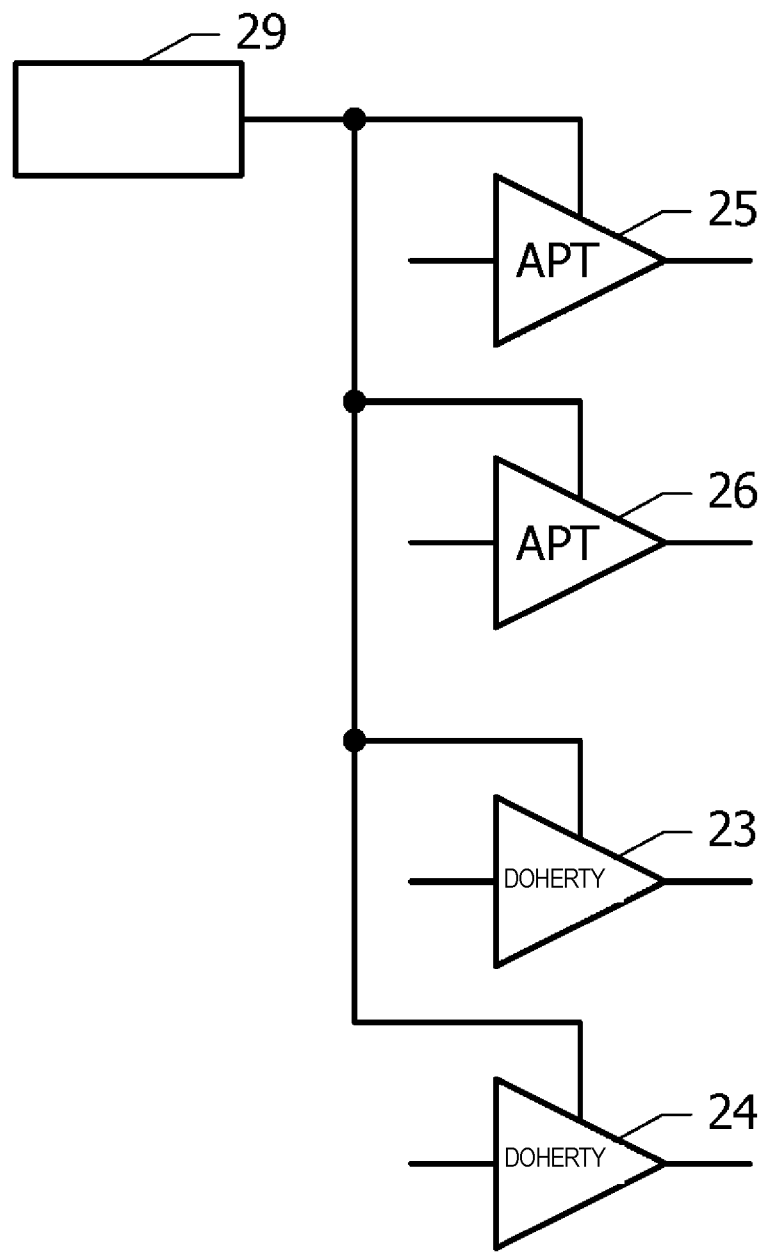
FIG. 9 is a block diagram illustrating a configuration of a transmit power amplifier of a communication device including a transceiver circuit according to a fourth embodiment.

FIG. 9 is a block diagram illustrating a configuration of a transmit power amplifier of a communication device including a transceiver circuit according to the fourth embodiment. In the first embodiment, the ET amplifiers 21 and (FIG. 1) are used as low-band and middle-band power amplifiers, respectively. In the fourth embodiment, average power tracking (APT) amplifiers 25 and 26 are used as low-band and middle-band power amplifiers, respectively. As in the first embodiment, the Doherty amplifiers 23 and 24 are used as high-band and ultra-high-band power amplifiers, respectively.

An average power tracking power supply circuit 29 is used as a power supply for the APT amplifiers 25 and 26. The average power tracking power supply circuit 29 also supplies a power supply to the Doherty amplifiers 23 and 24. The power supply circuit 29 is implemented using, for example, a DC-DC converter whose output voltage is variable.

Figure 10:
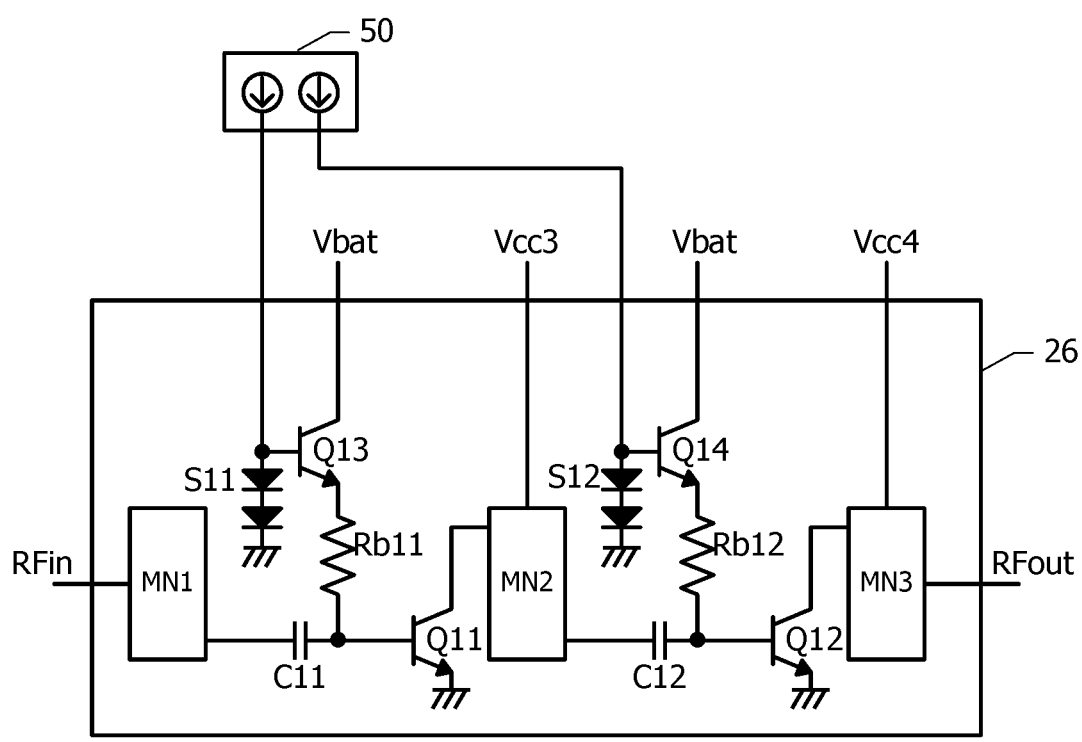
FIG. 10 is an equivalent circuit diagram of a middle-band average power tracking (APT) amplifier included in the transceiver circuit according to the fourth embodiment.

FIG. 10 is an equivalent circuit diagram of the middle-band APT amplifier 26. The low-band APT amplifier 25 has a circuit configuration similar to the middle-band APT amplifier 26.

The APT amplifier 26 includes a transistor Q11 of a driver-stage amplifier, and a transistor Q12 of an output-stage amplifier. An emitter follower transistor Q13, a bias resistance element Rb11, and a temperature compensation circuit S11 constitute a bias circuit for the transistor Q11 in the driver stage. Likewise, an emitter follower transistor Q14, a bias resistance element Rb12, and a temperature compensation circuit S12 constitute a bias circuit for the transistor Q12 in the output stage.

A bias power supply voltage Vbat is applied to the base of the transistor Q11 via the emitter follower transistor Q13 and the bias resistance element Rb11, and is also applied to the base of the transistor Q12 via the emitter follower transistor Q14 and the bias resistance element Rb12. A control circuit 50 supplies a bias current to each of the emitter follower transistors Q13 and Q14.

An FDD transmit signal RFin is input to the base of the transistor Q11 via a matching network MN1 and an input capacitor C11. A transmit signal amplified by the transistor Q11 is output from the collector of the transistor Q11 and is input to the base of the transistor Q12 via a matching network MN2 and an input capacitor C12. A transmit signal amplified by the transistor Q12 is output from the collector of the transistor Q12 and is output as a transmit signal RFout via a matching network MN3.

Power supply voltages Vcc3 and Vcc4 for average power tracking are applied to the collectors of the transistors Q11 and Q12 via the matching networks MN2 and MN3, respectively.

Figure 11:
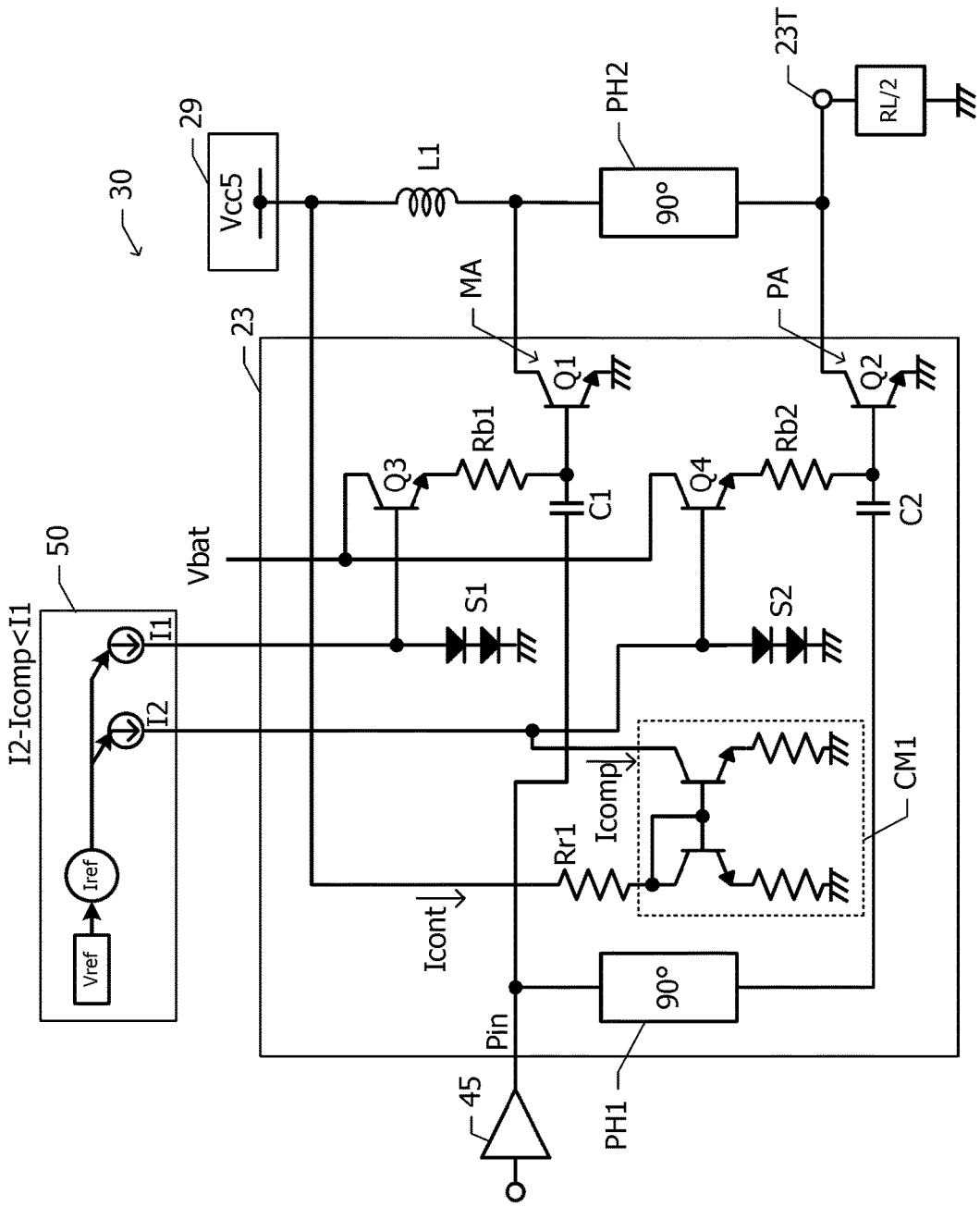
FIG. 11 is an equivalent circuit diagram of a high-band Doherty amplifier and its peripheral circuits included in the transceiver circuit according to the fourth embodiment.

FIG. 11 is an equivalent circuit diagram of the high-band Doherty amplifier 23 and its peripheral circuits. The ultra-high-band Doherty amplifier 24 (FIG. 9) has a circuit configuration similar to the high-band Doherty amplifier 23.

The basic configuration of the Doherty amplifier 23 is substantially the same as the configuration of the Doherty amplifier 23 of the transceiver circuit 30 according to the first embodiment (FIG. 3). In the fourth embodiment, an output circuit of a current mirror circuit CM1 is connected between a path for supplying a bias current to the emitter follower transistor Q4 of the bias circuit for the transistor Q2 of the peak amplifier PA and ground. An output current Icomp having substantially the same magnitude as a control current Icont flowing through a reference circuit of the current mirror circuit CM1 flows through the output circuit of the current mirror circuit CM1. The reference circuit and the output circuit of the current mirror circuit CM1 have transistors, each of which is implemented using a heterojunction bipolar transistor.

The collector of the transistor of the reference circuit of the current mirror circuit CM1 is connected to the power supply circuit 29 via a reference resistance element Rr1, and a power supply voltage Vcc5 for average power tracking is applied to the reference resistance element Rr1. The control current Icont flows through the reference circuit of the current mirror circuit CM1 and the reference resistance element Rr1. The control current Icont changes with a change in the power supply voltage Vcc5. The output current Icomp flows through the output circuit of the current mirror circuit CM1 in accordance with the control current Icont. Therefore, the output current Icomp also changes with a change in the power supply voltage Vcc5.

A portion of the bias current I2 supplied from the control circuit 50 to the base of the emitter follower transistor Q4 branches and flows through the output circuit of the current mirror circuit CM1. Accordingly, the bias current supplied to the base of the emitter follower transistor Q4 decreases. The decrease of the bias current is equal to the output current Icomp of the current mirror circuit CM1.

Next, the operation of the Doherty amplifier 23 will be described.

The average power tracking power supply circuit 29 is used as a power supply for the Doherty amplifier 23. As the average output power of the Doherty amplifier 23 decreases, the power supply voltage Vcc5 also decreases. Since the saturation power of the main amplifier MA and the peak amplifier PA of the Doherty amplifier 23 is proportional to the square of the power supply voltage Vcc5, as the power supply voltage Vcc5 decreases, the saturation power of the main amplifier MA and the peak amplifier PA also decreases. However, the operation start point of the peak amplifier PA, which is biased for Class C operation, depends on the input power level and thus is not necessarily related to the power supply voltage Vcc5.

If the saturation power of the main amplifier MA decreases with a decrease in the power supply voltage Vcc5, the threshold for the input power level at which the peak amplifier PA starts operating needs to be reduced in accordance with the decrease in the saturation power of the main amplifier MA. In the fourth embodiment, as the power supply voltage Vcc5 decreases, the output current Icomp of the current mirror circuit CM1 decreases. Consequently, the current drawn from the base current for the emitter follower transistor Q4 decreases, and the bias current of the transistor Q2 increases.

Accordingly, the bias current of the transistor Q2 of the peak amplifier PA increases, and the threshold for the input power level at which the peak amplifier PA starts operating is reduced. Thus, even if the power supply voltage Vcc5 changes in accordance with the average output power, the Doherty amplifier 23 can be maintained under normal operation. In this manner, the current mirror circuit CM1 serves as a bias current adjustment circuit that changes the bias current of the transistor Q2 of the peak amplifier PA to allow the peak amplifier PA to operate from a low input signal level when the power supply voltage Vcc5 supplied from the power supply circuit 29 decreases.

The bias current of the emitter follower transistor Q4 is equal to a value given by I2−Icomp. The bias current is set to be smaller than the bias current I1 of the emitter follower transistor Q3 in the bias circuit for the transistor Q1 of the main amplifier MA.

Next, advantageous effects of the fourth embodiment will be described.

In the fourth embodiment, as illustrated in FIG. 9, the power supply circuit 29 is used as a common power supply for the low-band APT amplifier 25 and the middle-band APT amplifier 26, which support the FDD scheme, and the high-band Doherty amplifier 23 and the ultra-high-band Doherty amplifier 24, which support the TDD scheme. The power supply circuit 29 can be implemented using a step-down DC-DC converter or a step-up/down DC-DC converter, which can be realized at lower cost than an envelope tracking power supply. Thus, a communication device supporting multiple bands can be achieved at low cost.

Next, a first modification of the fourth embodiment will be described with reference to FIG. 12.

Figure 12:
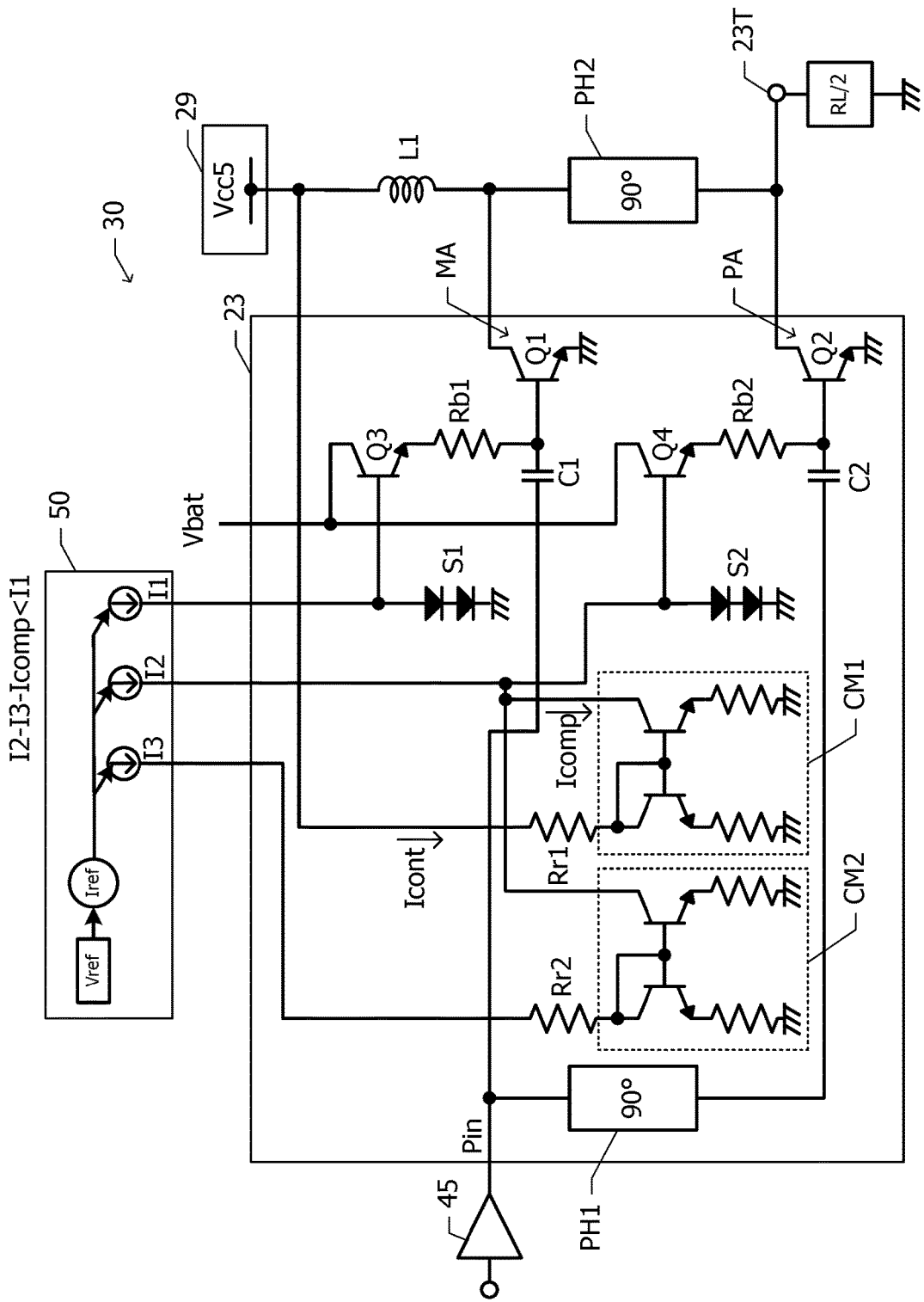
FIG. 12 is an equivalent circuit diagram of a Doherty amplifier and its peripheral circuits included in a transceiver circuit according to a first modification of the fourth embodiment.

FIG. 12 is an equivalent circuit diagram of a Doherty amplifier 23 and its peripheral circuits included in a transceiver circuit 30 according to the first modification of the fourth embodiment. In the first modification of the fourth embodiment, an output circuit of another current mirror circuit CM2 is connected in parallel to the output circuit of the current mirror circuit CM1. A reference circuit of the current mirror circuit CM2 is connected to the control circuit 50 via a reference resistance element Rr2. A constant output current I3 is supplied to the reference resistance element Rr2 and the reference circuit of the current mirror circuit CM2. Thus, the constant output current I3 also flows through the output circuit of the current mirror circuit CM2.

In the first modification, the current equal to the sum of the output current Icomp of the current mirror circuit CM1 and the output current I3 of the current mirror circuit CM2 is drawn from the base current for the emitter follower transistor Q4. The bias current of the emitter follower transistor Q4 is equal to a value given by I2−I3−Icomp. The bias current is set to be smaller than the bias current I1 of the emitter follower transistor Q3 in the bias circuit for the transistor Q1 of the main amplifier MA.

Next, advantageous effects of the first modification of the fourth embodiment will be described.

The flow of the constant output current I3 in parallel to the output current Icomp of the current mirror circuit CM1 can reduce the influence of variation in characteristics of the current mirror circuit CM1.

Next, a second modification of the fourth embodiment will be described with reference to FIG. 13.

Figure 13:
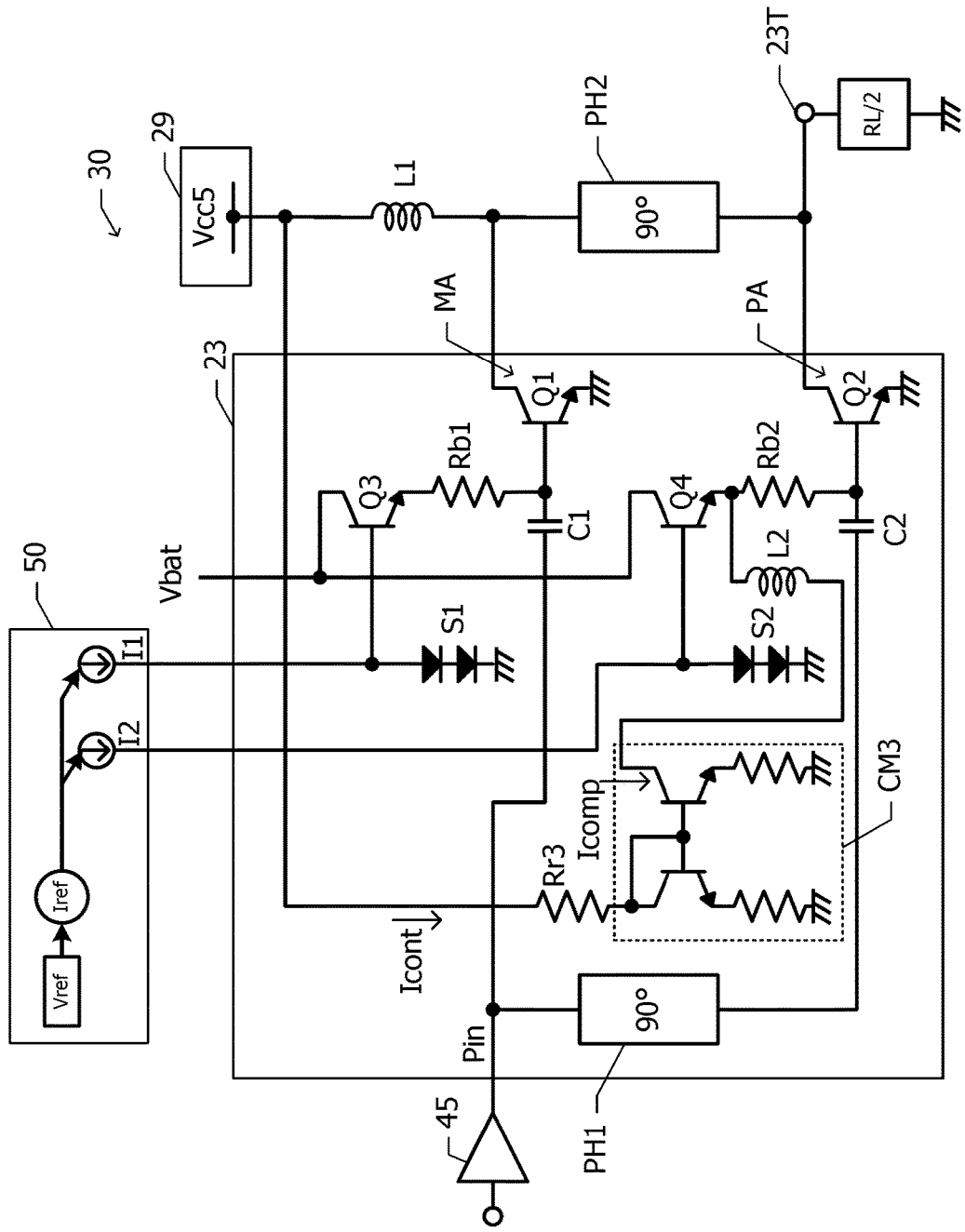
FIG. 13 is an equivalent circuit diagram of a Doherty amplifier and its peripheral circuits included in a transceiver circuit according to a second modification of the fourth embodiment.

FIG. 13 is an equivalent circuit diagram of a Doherty amplifier 23 and its peripheral circuits included in a transceiver circuit 30 according to the second modification of the fourth embodiment. In the fourth embodiment (FIG. 11), the output circuit of the current mirror circuit CM1 is connected to the bias current path of the emitter follower transistor Q4. In the second modification of the fourth embodiment, an output circuit of a current mirror circuit CM3 is connected to the emitter of the emitter follower transistor Q4 via an inductor L2 for blocking high-frequency current. The power supply voltage Vcc5 is applied to a reference circuit of the current mirror circuit CM3 from the power supply circuit 29 via a reference resistance element Rr3.

Next, advantageous effects of the second modification of the fourth embodiment will be described.

In the second modification of the fourth embodiment, the current having an amount corresponding to the output current Icomp of the current mirror circuit CM3 is drawn from a path for the bias current flowing from the emitter of the emitter follower transistor Q4 to the base of the transistor Q2 of the peak amplifier PA. The output current Icomp changes in accordance with the power supply voltage Vcc5. As the power supply voltage Vcc5 decreases, the output current Icomp also decreases. Thus, as the power supply voltage Vcc5 decreases, the bias current of the transistor Q2 of the peak amplifier PA increases. Accordingly, as in the fourth embodiment, even if the power supply voltage Vcc5 changes in accordance with the average output power, the Doherty amplifier 23 can be maintained under normal operation.

Next, a third modification of the fourth embodiment will be described with reference to FIG. 14.

Figure 14:
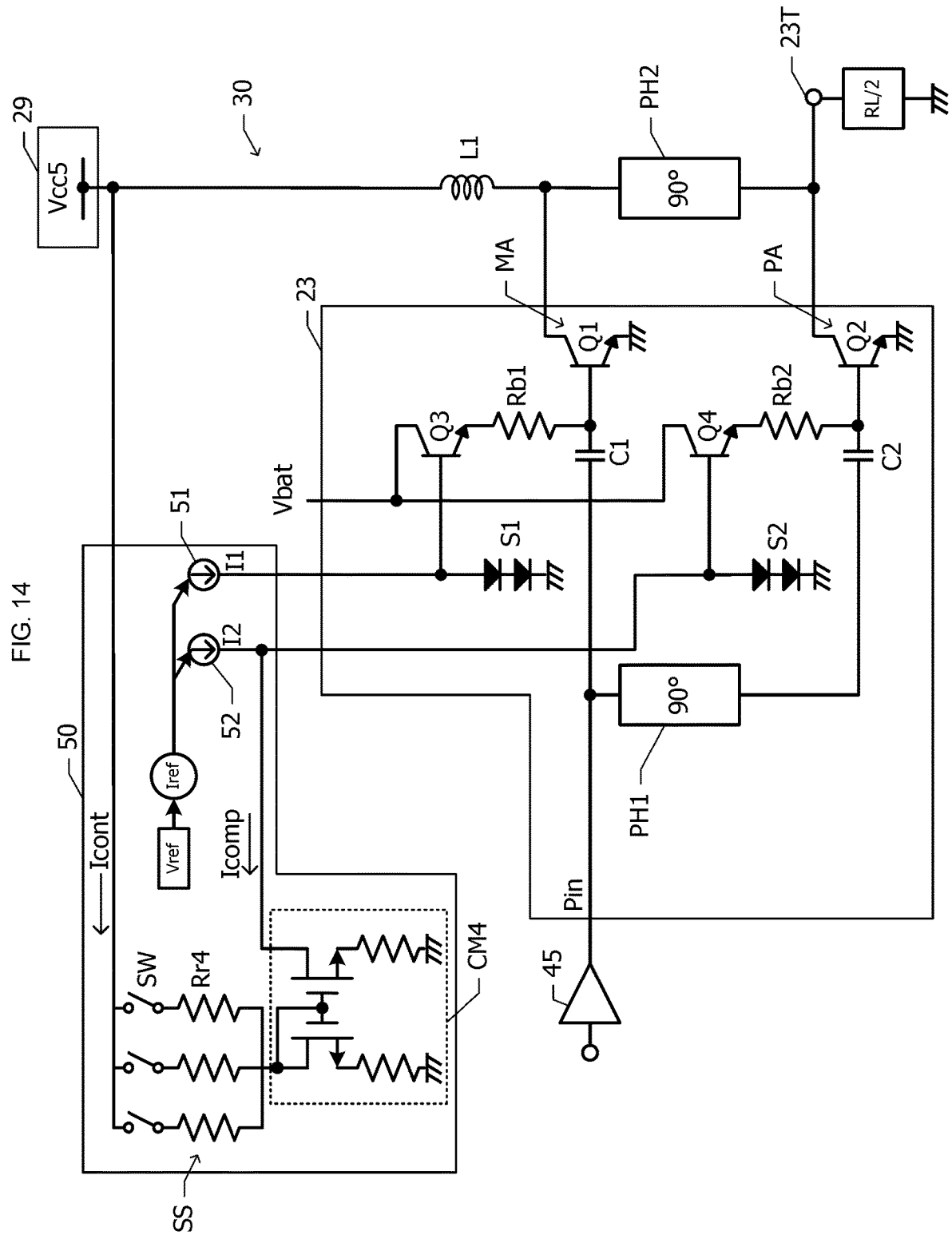
FIG. 14 is an equivalent circuit diagram of a Doherty amplifier and its peripheral circuits included in a transceiver circuit according to a third modification of the fourth embodiment.

FIG. 14 is an equivalent circuit diagram of a Doherty amplifier 23 and its peripheral circuits included in a transceiver circuit 30 according to the third modification of the fourth embodiment. In the fourth embodiment (FIG. 11), the output circuit of the current mirror circuit CM1 is connected to the bias current path of the emitter follower transistor Q4. In the third modification of the fourth embodiment, the control circuit 50 includes a circuit for adjusting the bias current of the emitter follower transistor Q4.

The control circuit 50 is provided with a current mirror circuit CM4. The current mirror circuit CM4 has transistors, each of which is implemented using a metal oxide semiconductor (MOS) transistor, for example. A reference circuit of the current mirror circuit CM4 is connected to the power supply circuit 29 via a sensitivity switching circuit SS. The power supply voltage Vcc5 is applied to the reference circuit of the current mirror circuit CM4 via the sensitivity switching circuit SS.

The sensitivity switching circuit SS includes a plurality of reference resistance elements Rr4 that are connected in parallel to each other. Switches SW are each connected in series with one of the reference resistance elements Rr4. The plurality of reference resistance elements Rr4 have different resistance values. Switching among the reference resistance elements Rr4, which are turned on by the switches SW, can change the value of a reference resistor inserted between the reference circuit of the current mirror circuit CM4 and the power supply circuit 29.

An output circuit of the current mirror circuit CM4 is connected between a bias current path connecting a current source 52 and the Doherty amplifier 23 and ground. When the output current Icomp of the current mirror circuit CM4 changes, the bias current of the emitter follower transistor Q4 changes.

Next, advantageous effects of the third modification of the fourth embodiment will be described.

In the third modification of the fourth embodiment, the plurality of switches SW can be controlled to select a resistance element to be turned on from among the plurality of reference resistance elements Rr4, thereby switching the sensitivity with which the output current Icomp changes in response to a change in the power supply voltage Vcc5. This achieves an advantageous effect of enhancing the flexibility of setting the bias conditions of the transistor Q2 of the peak amplifier PA.

Next, a fourth modification of the fourth embodiment will be described with reference to FIG. 15.

Figure 15:
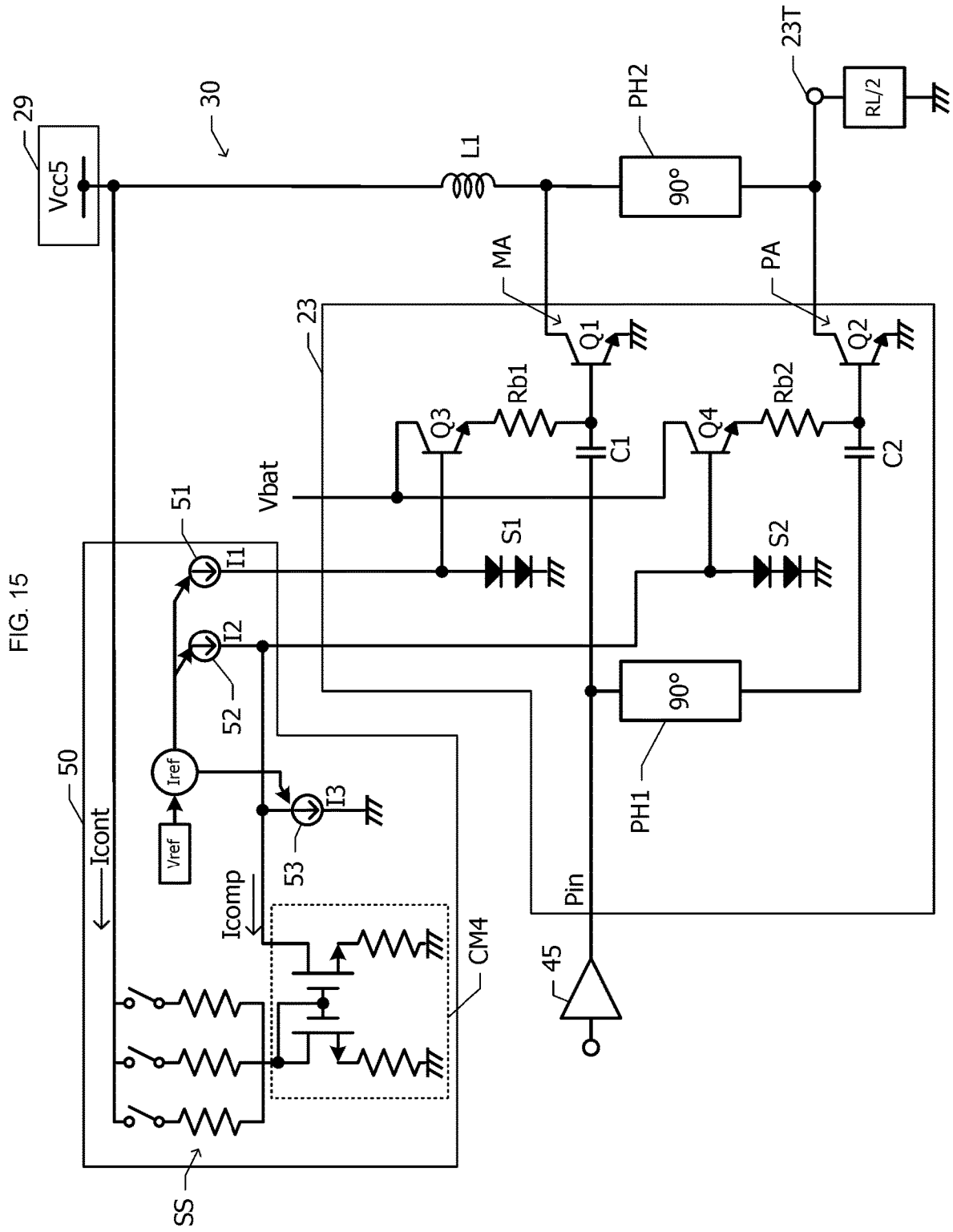
FIG. 15 is an equivalent circuit diagram of a Doherty amplifier and its peripheral circuits included in a transceiver circuit according to a fourth modification of the fourth embodiment.

FIG. 15 is an equivalent circuit diagram of a Doherty amplifier 23 and its peripheral circuits included in a transceiver circuit 30 according to the fourth modification of the fourth embodiment. In the fourth modification of the fourth embodiment, a current source 53 is connected in parallel to the output circuit of the current mirror circuit CM4 in the control circuit 50 (FIG. 14) included in the transceiver circuit 30 according to the third modification. The current source 53 generates a constant output current I3 on the basis of the reference current Iref. Thus, the current having an amount corresponding to the sum of the output current Icomp of the current mirror circuit CM4 and the constant output current I3 of the current source 53 is drawn from the bias current I2 supplied from the current source 52.

Next, advantageous effects of the fourth modification of the fourth embodiment will be described. In the fourth modification, the addition of the constant output current I3 of the current source 53 to the output current Icomp of the current mirror circuit CM4 can reduce the influence of variation in characteristics of the current mirror circuit CM4.

Next, a fifth modification of the fourth embodiment will be described with reference to FIG. 16.

Figure 16:
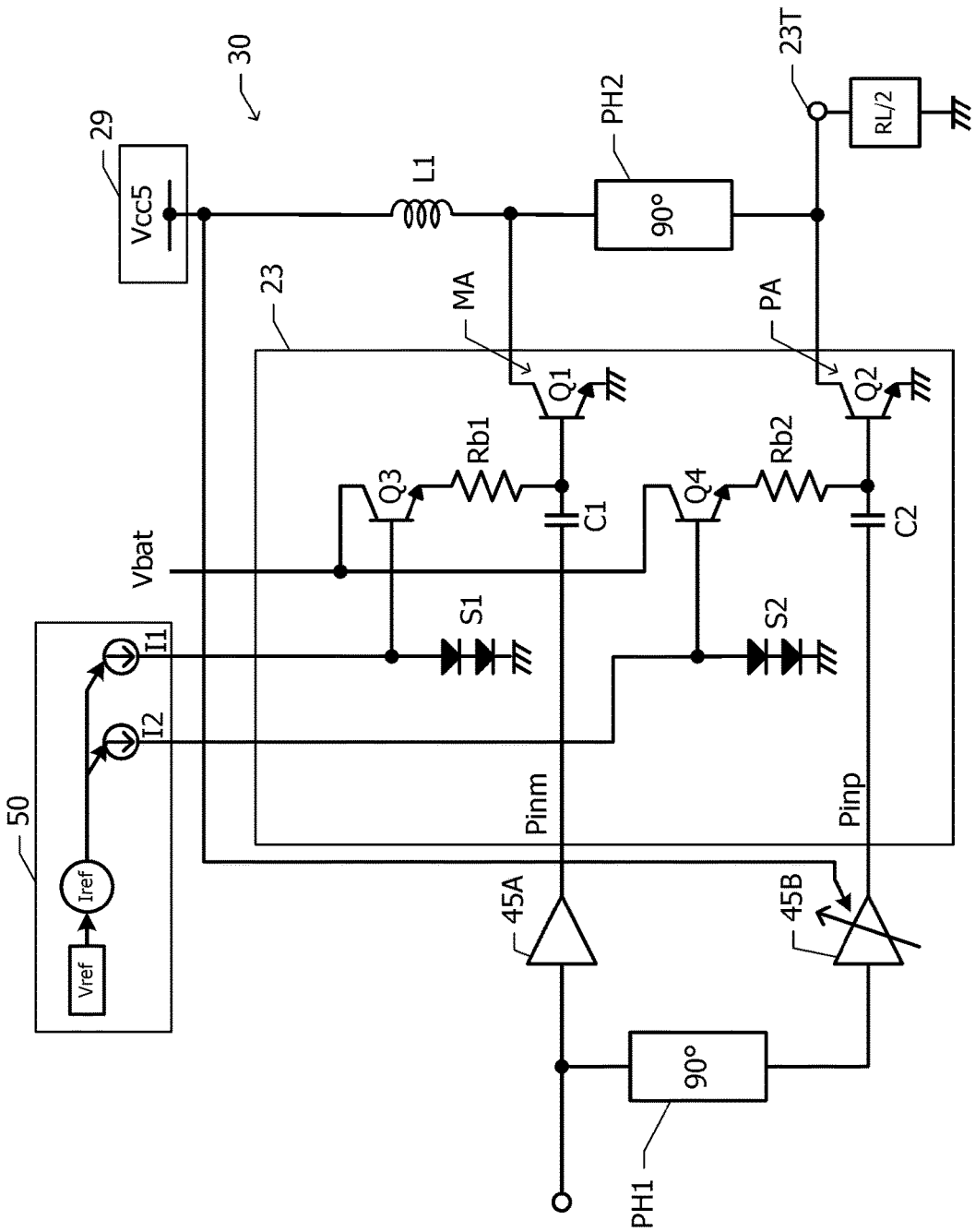
FIG. 16 is an equivalent circuit diagram of a Doherty amplifier and its peripheral circuits included in a transceiver circuit according to a fifth modification of the fourth embodiment.

FIG. 16 is an equivalent circuit diagram of a Doherty amplifier 23 and its peripheral circuits included in a transceiver circuit 30 according to the fifth modification of the fourth embodiment. In the fourth embodiment, to reduce the threshold for the input power level at which the peak amplifier PA starts operating in accordance with a decrease in the saturation power of the main amplifier MA due to a decrease in the power supply voltage Vcc5, the bias current of the transistor Q1 of the peak amplifier PA is increased. In the fifth modification of the fourth embodiment, instead of reduction of the threshold for the input power level at which the peak amplifier PA starts operating, the input power level to the peak amplifier PA is increased.

In the fifth modification of the fourth embodiment, a main-amplifier driver-stage amplifier 45A and a peak-amplifier driver-stage amplifier 45B are provided for the main amplifier MA and the peak amplifier PA of the Doherty amplifier 23, respectively. A high-frequency signal is input to the driver-stage amplifier 45B via a 90° phase shift circuit PH1. A high-frequency signal Pinm amplified by the driver-stage amplifier 45A is input to the base of the transistor Q1 of the main amplifier MA, and a high-frequency signal Pinp amplified by the driver-stage amplifier 45B is input to the base of the transistor Q2 of the peak amplifier PA. The gain of the driver-stage amplifier 45B changes with a change in the power supply voltage Vcc5. Specifically, as the power supply voltage Vcc5 decreases, the gain of the driver-stage amplifier 45B increases.

Next, advantageous effects of the fifth modification of the fourth embodiment will be described.

In the fifth modification of the fourth embodiment, as the power supply voltage Vcc5 decreases, the gain of the driver-stage amplifier 45B increases. Thus, an advantage similar to that of reducing the threshold for the input power level at which the peak amplifier PA starts operating can be achieved.

When the threshold for the input power level at which the peak amplifier PA starts operating is controlled by changing the bias current of the transistor Q1, the sensitivity of control may be excessively high so that it is difficult to perform appropriate control. In addition, the controllable range is small in response to a change in the power supply voltage Vcc5. In the fifth modification of the fourth embodiment, the gain of the driver-stage amplifier 45B is controlled in accordance with a change in the power supply voltage Vcc5, and thus a condition in which the peak amplifier PA starts operating can be easily optimized. In addition, an advantageous effect is achieved such that the controllable range is wide in response to a change in the power supply voltage Vcc5. Thus, even if the power supply voltage Vcc5 largely changes, the operation of the Doherty amplifier 23 can be appropriately maintained.

It is to be understood that the embodiments described above are illustrative and that configurations provided in different embodiments may be partially replaced or combined. Similar operational effects achieved with similar configurations in a plurality of embodiments are not described in the individual embodiments. In addition, the present disclosure is not limited to the embodiments described above. It will be obvious to those skilled in the art that, for example, various changes, improvements, combinations, and so on may be made.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A transceiver circuit comprising:
   a Doherty amplifier including a main amplifier and a peak amplifier;
   a low noise amplifier;
   a first band pass filter connected between an output of the Doherty amplifier and an antenna port;
   a second band pass filter connected between an input of the low noise amplifier and the antenna port;
   an antenna switch configured to connect the first band pass filter to the antenna port during a transmission connection state in which a first signal output from the Doherty amplifier is supplied to the antenna port, and to connect the second band pass filter to the antenna port during a reception connection state in which a second signal received by the antenna port is inputted to the low noise amplifier; and
   a control circuit that is configured to control an operation of the Doherty amplifier by switching an operation mode of the Doherty amplifier between an envelope tracking mode and a Doherty mode.

2. The transceiver circuit according to claim 1,
   wherein the envelope tracking mode is a mode in which a second bias current supplied to the main amplifier and a first bias current supplied to the peak amplifier are substantially equal to each other, and
   wherein the Doherty mode is a mode in which the first bias current supplied to the peak amplifier is substantially zero.

3. The transceiver circuit according to claim 1,
   wherein the envelope tracking mode is a mode in which the main amplifier and the peak amplifier operate as envelope tracking amplifiers, and
   wherein the Doherty mode is a mode in which the main amplifier operates in Class AB and the peak amplifier operates in Class C.

4. A transceiver circuit comprising:
   a Doherty amplifier including a main amplifier and a peak amplifier;
   a low noise amplifier; and
   an antenna switch configured to selectively connect the Doherty amplifier and the low noise amplifier to an antenna port,
   wherein the Doherty amplifier is configured to operate in an envelope tracking (ET) mode and a Doherty mode, the ET mode being a mode in which the main amplifier and the peak amplifier operate as envelope tracking amplifiers, the Doherty mode being a mode in which a first bias current supplied to the peak amplifier is less than a second bias current supplied to the main amplifier.

5. The transceiver circuit according to claim 4, wherein the first bias current supplied to the peak amplifier is substantially zero in the Doherty mode.

6. The transceiver circuit according to claim 4, wherein the main amplifier operates in Class AB and the peak amplifier operates in Class C in the Doherty mode.

7. The transceiver circuit according to claim 4, wherein the second bias current supplied to the main amplifier and the first bias current supplied to the peak amplifier are substantially equal to each other in the ET mode.

8. The transceiver circuit according to claim 4, further comprising:

a control circuit that is configured to control an operation of the Doherty amplifier,
wherein the control circuit is configured to switch an operation mode of the Doherty amplifier between the ET mode and the Doherty mode.

9. A transceiver circuit comprising:
a Doherty amplifier including a main amplifier and a peak amplifier;
a low noise amplifier;
a first band pass filter connected between an output of the Doherty amplifier and an antenna port;
a second band pass filter connected between an input of the low noise amplifier and the antenna port; and
an antenna switch configured to connect the first band pass filter or the second band pass filter to the antenna port, wherein
the Doherty amplifier is configured to operate in an envelope tracking (ET) mode and a Doherty mode, the Doherty mode being a mode in which the main amplifier operates and the peak amplifier does not operate before an output power level of the main amplifier approaches a saturation level and both of the main amplifier and the peak amplifier operate after the output power level of the main amplifier approaches the saturation level.

10. The transceiver circuit according to claim 9, wherein a second bias current supplied to the main amplifier and a first bias current supplied to the peak amplifier are substantially equal to each other in the ET mode.

11. The transceiver circuit according to claim 9, further comprising:
a power supply circuit that is configured to supply a power supply voltage to the Doherty amplifier, wherein
the power supply circuit is configured to change a voltage waveform of the power supply voltage supplied to the main amplifier and the peak amplifier in accordance with an envelope of an input signal when an operation mode of the Doherty amplifier is the ET mode, and
the power supply circuit is configured to supply a constant power supply voltage to the main amplifier and the peak amplifier when the operation mode of the Doherty amplifier is the Doherty mode.

12. The transceiver circuit according to claim 9, further comprising:
a driver-stage amplifier that is connected to a preceding stage of the Doherty amplifier and is configured to amplify a high-frequency signal that is input to the Doherty amplifier,
wherein the driver-stage amplifier has a gain that is larger when an operation mode of the Doherty amplifier is the ET mode than when the operation mode of the Doherty amplifier is the Doherty mode.

13. The transceiver circuit according to claim 9, further comprising:
an average power tracking amplifier based on an average power tracking scheme; and
a power supply circuit that is configured to supply, to the average power tracking amplifier, a power supply having a voltage that changes in accordance with an output power,
wherein the power supply circuit is further configured to supply the power supply to the Doherty amplifier.

14. The transceiver circuit according to claim 13, further comprising:
a bias current adjustment circuit that is configured to change, in response to a decrease in a power supply voltage supplied from the power supply circuit, a first bias current of a transistor of the peak amplifier so that the peak amplifier operates from a low input signal level.

15. The transceiver circuit according to claim 4, further comprising:
a driver-stage amplifier that is connected to a preceding stage of the Doherty amplifier and is configured to amplify a high-frequency signal that is input to the Doherty amplifier,
wherein the driver-stage amplifier has a gain that is larger when an operation mode of the Doherty amplifier is the ET mode than when the operation mode of the Doherty amplifier is the Doherty mode.

16. The transceiver circuit according to claim 2, further comprising:
a driver-stage amplifier that is connected to a preceding stage of the Doherty amplifier and is configured to amplify a high-frequency signal that is input to the Doherty amplifier,
wherein the driver-stage amplifier has a gain that is larger when the operation mode of the Doherty amplifier is the envelope tracking mode than when the operation mode of the Doherty amplifier is the Doherty mode.

17. The transceiver circuit according to claim 4, further comprising:
an average power tracking amplifier based on an average power tracking scheme; and
a power supply circuit that is configured to supply, to the average power tracking amplifier, a power supply having a voltage that changes in accordance with an output power,
wherein the power supply circuit is further configured to supply the power supply to the Doherty amplifier.

18. The transceiver circuit according to claim 17, further comprising:
a bias current adjustment circuit that is configured to change, in response to a decrease in a power supply voltage supplied from the power supply circuit, the first bias current of a transistor of the peak amplifier so that the peak amplifier operates from a low input signal level.

19. The transceiver circuit according to claim 4, further comprising:
a power supply circuit that is configured to supply a power supply voltage to the Doherty amplifier, wherein
the power supply circuit is configured to change a voltage waveform of the power supply voltage supplied to the main amplifier and the peak amplifier in accordance with an envelope of an input signal when the operation mode of the Doherty amplifier is the ET mode, and
the power supply circuit is configured to supply a constant power supply voltage to the main amplifier and the peak amplifier when the operation mode of the Doherty amplifier is the Doherty mode.

\* \* \* \* \*